(12) United States Patent
Ahn et al.

(10) Patent No.: US 12,493,052 B2
(45) Date of Patent: Dec. 9, 2025

(54) ELECTRICALLY CONDUCTIVE CONTACT PIN, INSPECTION APPARATUS, AND MOLDED PRODUCT

(71) Applicant: POINT ENGINEERING CO., LTD., Chungcheongnam-do (KR)

(72) Inventors: Bum Mo Ahn, Gyeonggi-do (KR); Seung Ho Park, Gyeonggi-do (KR); Sung Hyun Byun, Gyeonggi-do (KR)

(73) Assignee: POINT ENGINEERING CO., LTD., Chungcheongnam-do (KR)

( * ) Notice: Subject to any disclaimer, the term of this patent is extended or adjusted under 35 U.S.C. 154(b) by 200 days.

(21) Appl. No.: 18/031,607

(22) PCT Filed: Oct. 7, 2021

(86) PCT No.: PCT/KR2021/013771
§ 371 (c)(1),
(2) Date: Apr. 12, 2023

(87) PCT Pub. No.: WO2022/080755
PCT Pub. Date: Apr. 21, 2022

(65) Prior Publication Data
US 2023/0384346 A1    Nov. 30, 2023

(30) Foreign Application Priority Data
Oct. 14, 2020   (KR) .................. 10-2020-0132525

(51) Int. Cl.
*G01R 1/04* (2006.01)
*H01R 13/24* (2006.01)
*H01R 43/16* (2006.01)

(52) U.S. Cl.
CPC ....... *G01R 1/0408* (2013.01); *H01R 13/2407* (2013.01); *H01R 43/16* (2013.01)

(58) Field of Classification Search
CPC .............. G01R 1/0408; G01R 1/06733; G01R 1/06711; G01R 1/06755; G01R 3/00; H01R 13/2407; H01R 43/16; H01R 13/03
See application file for complete search history.

(56) References Cited

U.S. PATENT DOCUMENTS 7,225,538 B2 * 6/2007 Eldridge .................. C25D 5/12
257/E21.507
7,287,326 B2 * 10/2007 Kirby ..................... H05K 3/326
29/874

(Continued)

FOREIGN PATENT DOCUMENTS

JP    2000294043    10/2000
JP    2006326723    12/2006

(Continued)

OTHER PUBLICATIONS

"Office Action of Taiwan Counterpart Application", issued on Apr. 2, 2025, with English translation thereof, pp. 1-10.

(Continued)

*Primary Examiner* — Akm Zakaria
(74) *Attorney, Agent, or Firm* — JCIPRNET

(57) ABSTRACT

Proposed are an electrically conductive contact pin, a method for manufacturing the same, an inspection apparatus, a method for manufacturing a molded product, and a molded product manufactured thereby. More specifically, proposed are: a method for manufacturing an electrically conductive contact pin, the method including the steps of providing an anodic aluminum oxide mold made of an anodic aluminum oxide film and having openings formed by etching at least partial regions of the anodic aluminum oxide mold to correspond to a shape of electrically conductive contact pins, forming a metal filler in each of the openings, and removing the anodic aluminum oxide mold; an electrically conductive contact pin including at least one micro- (Continued)

convex portion and a plurality of fine trenches; an inspection apparatus; a method for manufacturing a molded product; and a molded product manufactured thereby.

8 Claims, 26 Drawing Sheets

(56) References Cited

U.S. PATENT DOCUMENTS

| | | | | |
|---|---|---|---|---|
| 11,817,646 | B2* | 11/2023 | Chen | H01R 13/2457 |
| 2001/0027008 | A1* | 10/2001 | Matsumoto | H01L 21/7684 |
| | | | | 438/618 |
| 2005/0229393 | A1* | 10/2005 | Kirby | H05K 3/326 |
| | | | | 29/874 |
| 2008/0171452 | A1 | 7/2008 | Yakabe et al. | |
| 2011/0030210 | A1* | 2/2011 | King, Jr. | H01R 4/484 |
| | | | | 29/857 |
| 2011/0169515 | A1* | 7/2011 | Nielsen | G01R 31/2887 |
| | | | | 324/750.16 |
| 2012/0049274 | A1* | 3/2012 | Elattari | H01L 21/743 |
| | | | | 257/330 |
| 2015/0126081 | A1* | 5/2015 | Oda | B23K 35/262 |
| | | | | 439/887 |
| 2019/0064215 | A1 | 2/2019 | Park | |
| 2020/0006880 | A1 | 1/2020 | Esmaeili et al. | |
| 2024/0019461 | A1* | 1/2024 | Miyaaki | G01R 1/0483 |
| 2024/0019462 | A1* | 1/2024 | Miyaaki | G01R 1/0466 |
| 2024/0385222 | A1* | 11/2024 | Cheng | G01R 1/06727 |

FOREIGN PATENT DOCUMENTS

| | | |
|---|---|---|
| KR | 100449308 | 9/2004 |
| KR | 1020110126116 | 11/2011 |
| KR | 101154519 | 6/2012 |
| KR | 1020150053550 | 5/2015 |
| KR | 20200090564 | 7/2020 |
| TW | 201915222 | 4/2019 |

OTHER PUBLICATIONS

"Search Report of Europe Counterpart Application", issued on Sep. 24, 2024, p. 1-p. 7.

"Request for the Submission of an Opinion of Korea Counterpart Application", with English translation thereof, issued on Nov. 28, 2024, pp. 1-17.

"International Search Report (Form PCT/ISA/210) of PCT/KR2021/013771", mailed on Jan. 7, 2022, with English translation thereof, pp. 1-5.

* cited by examiner

ELECTRICALLY CONDUCTIVE CONTACT PIN, INSPECTION APPARATUS, AND MOLDED PRODUCT

CROSS-REFERENCE TO RELATED APPLICATION

This application is a 371 of international application of PCT application serial no. PCT/KR2021/013771, filed on Oct. 7, 2021, which claims the priority benefit of Korea application no. 10-2020-0132525, filed on Oct. 14, 2020. The entirety of each of the above mentioned patent applications is hereby incorporated by reference herein and made a part of this specification.

TECHNICAL FIELD

The present disclosure relates to an electrically conductive contact pin, a method for manufacturing the same, an inspection apparatus, a method for manufacturing a molded product, and a molded product manufactured thereby.

RELATED ART

The present disclosure relates to an electrically conductive contact pin, at least a partial configuration of which has a dimension range of several micrometers to several tens of micrometers, a method for manufacturing the same, an inspection apparatus, a method for manufacturing a molded product, and a molded product manufactured thereby.

Electrically conductive contact pins are contact pins that can be used in probe cards or test sockets that contact and inspect an object. Hereinafter, a contact pin used in a probe card will be described as an example.

A test for electrical characteristics of a semiconductor device is performed by approaching a wafer to a probe card having a plurality of contact pins and then bringing the contact pins into contact with corresponding electrode pads on the wafer. When bringing the contact pins into contact with the electrode pads on the wafer, a process of further bringing the wafer into contact with the probe card is performed after reaching a state in which the contact pins and the electrode pads begin to make contact with each other. This process is called overdrive. Overdrive is a process that elastically deforms the contact pins. By the overdrive process, all the contact pins can be reliably brought into contact with the electrode pads even when the heights of the electrode pads or the heights of the contact pins vary. In addition, as each contact pin is elastically deformed during the overdrive process and a tip thereof moves on an electrode pad, scrubbing is performed. The scrubbing removes an oxide film on a surface of the electrode pad and can reduce contact resistance.

In the manufacture of contact pins, a method of manufacturing contact pins using laser technology is generally used. For example, there is a method of manufacturing contact pins by cutting a substrate made of a conductive material with a laser beam. The laser beam cuts the substrate along a predetermined profile corresponding to each contact pin and forms sharp edges on the contact pin through different operations. However, such laser cutting technology for manufacturing contact pins by cutting a metal sheet along a profile corresponding to the final shape of each contact pin has limitations in improving the dimensional accuracy of the contact pin. Also, since the contact pins have to be cut individually with a laser beam, a problem arises in that the production speed of the contact pins is reduced.

Meanwhile, contact pins may be manufactured using an MEMS process. A process of manufacturing a contact pin using the MEMS process involves first applying a photoresist to a surface of a conductive substrate and then patterning the photoresist. After that, a metal material is deposited on the exposed surface of the conductive substrate within openings by electroplating, and the photoresist and the conductive substrate are removed to obtain contact pins. The contact pins thus manufactured using the MEMS process are referred to as 2D MEMS contact pins. The shape of these MEMS contact pins is the same as that of the openings formed in a photoresist mold. In this case, the thickness of the MEMS contact pins is affected by the height of the photoresist mold.

When using a photoresist as a mold for electroplating, it is difficult to sufficiently increase the height of the mold only with the use of a single-layer photoresist. As a result, it is also difficult to sufficiently increase the thickness of the contact pins. The MEMS contact pins need to be manufactured with a predetermined thickness in consideration of electrical conductivity, restoring force, brittle fracture, etc. In order to increase the thickness of the MEMS contact pins, a mold in which photoresists are stacked in multiple layers may be used. In this case, however, since each photoresist layer is slightly stepped, a side surface of each contact pin is not formed vertically and a stepped area minutely remains. In addition, when the photoresists are stacked in multiple layers, it is difficult to accurately reproduce the shape of the contact pins having a dimension range of equal to or less than several to several tens of µm.

CITATION LIST

Patent Literature

[Patent Literature 1] Korean Patent No. 10-0449308

SUMMARY OF INVENTION

Technical Problem

Accordingly, the present disclosure has been made keeping in mind the above problems occurring in the related art, and an objective of the present disclosure is to provide an electrically conductive contact pin, a method for manufacturing the same, an inspection apparatus, a method for manufacturing a molded product, and a molded product manufactured thereby, in which a contact pin having a vertical side surface with a sufficient height is manufactured by using an anodic aluminum oxide mold instead of a conventional photoresist mold.

Another objective of the present disclosure is to provide an electrically conductive contact pin, a method for manufacturing the same, an inspection apparatus, a method for manufacturing a molded product, and a molded product manufactured thereby, in which the contact pin is manufactured precisely and reliably even when at least a partial configuration thereof has a dimension range of several µm to several tens of µm compared to a conventional electrically conductive contact pin.

Another objective of the present disclosure is to provide an electrically conductive contact pin, a method for manufacturing the same, an inspection apparatus, a method for manufacturing a molded product, and a molded product manufactured thereby, in which the surface area of a side surface of the contact pin is increased even when the contact pin has the same shape and dimensions as a conventional electrically conductive contact pin.

Solution to Problem

In order to accomplish the above objectives, according to one aspect of the present disclosure, there is provided a method of manufacturing an electrically conductive contact pin, the method including: providing an anodic aluminum oxide mold made of an anodic aluminum oxide film and having openings formed by etching at least partial regions of the anodic aluminum oxide mold to correspond to a shape of electrically conductive contact pins; forming a metal filler in each of the openings; and removing the anodic aluminum oxide mold.

In addition, the anodic aluminum oxide mold may have a thickness in a range of 10 μm to 150 μm, and the openings may have vertical side surfaces.

Meanwhile, according to another aspect of the present disclosure, there is provided an electrically conductive contact pin including a plurality of fine trenches formed on at least one surface of the contact pin.

In addition, the fine trenches may be formed on a side surface of the contact pin.

In addition, the fine trenches may be formed long on a side surface of the contact pin in a thickness direction of the contact pin.

In addition, the fine trenches may have a depth in a range of 20 nm to 1 μm.

Meanwhile, according to another aspect of the present disclosure, there is provided an electrically conductive contact pin having a first surface, a second surface opposite to the first surface, a side surface connecting the first surface and the second surface to each other, the electrically conductive contact pin including a plurality of fine trenches formed side by side on the side surface of the contact pin in the form of long grooves extending toward the first surface and the second surface.

In addition, the contact pin may have a thickness in a range of 10 μm to 150 μm, and the side surface of the contact pin may have a vertical shape with a verticality in a range of 0.1° to 3°.

In addition, the fine trenches may be formed on the entire side surface of the contact pin, and may not be formed on the first and second surfaces.

In addition, the electrically conductive contact pin may further include a slit formed inside the contact pin so as to pass through the first and second surfaces.

In addition, the electrically conductive contact pin may further include a slit fine trench formed long on a side surface of the slit in a thickness direction of the contact pin.

In addition, the contact pin may be formed by stacking a plurality of layers in a thickness direction of the contact pin, and the same layers may be made of the same metal material.

Meanwhile, according to another aspect of the present disclosure, there is provided an electrically conductive contact pin having a first surface, a second surface opposite to the first surface, a side surface connecting the first surface and the second surface to each other, wherein a roughness range of the side surface may be different from roughness ranges of the first surface and the second surface.

In addition, the roughness range of the side surface may be greater than the roughness ranges of the first surface and the second surface.

Meanwhile, according to another aspect of the present disclosure, there is provided an electrically conductive contact pin including: at least one micro-trench formed on a side surface of the contact pin and extending in a thickness direction of the contact pin with a depth in a range of 1 μm to 10 μm; and a plurality of fine trenches formed on the side surface of the contact pin and extending in the thickness direction of the contact pin with a depth in a range of 20 nm to 1 μm.

Meanwhile, according to another aspect of the present disclosure, there is provided an electrically conductive contact pin including: at least one micro-convex portion formed on a side surface of the contact pin and extending in a thickness direction of the contact pin with a height in a range of 1 μm to 10 μm; and a plurality of fine trenches formed on the side surface of the contact pin and extending in the thickness direction of the contact pin with a depth in a range of 20 nm to 1 μm.

Meanwhile, according to another aspect of the present disclosure, there is provided an electrically conductive contact pin, wherein at least a partial configuration constituting a shape of the contact pin may have a dimension range of 1 μm to 10 μm, and the dimension range of 1 μm to 10 μm of the partial configuration may be a dimension range in which a design pattern is transferred and may not be a dimension range formed regardless of the design pattern.

Meanwhile, according to another aspect of the present disclosure, there is provided an inspection apparatus including an electrically conductive contact pin configured to make contact with an inspection object, wherein at least a partial configuration constituting a side surface shape of the contact pin may have a dimension range of 1 μm to 10 μm, and the dimension range of 1 μm to 10 μm of the partial configuration may be a dimension range in which a design pattern is transferred and may not be a dimension range formed regardless of the design pattern.

In addition, the inspection apparatus may be a probe card.

In addition, the inspection apparatus may be a test socket.

Meanwhile, according to another aspect of the present disclosure, there is provided a molded product, wherein at least a partial configuration constituting a shape of the molded product may have a dimension range of 1 μm to 10 μm, and the dimension range of 1 μm to 10 μm of the partial configuration may be a dimension range in which a design pattern is transferred and may not be a dimension range formed regardless of the design pattern.

In addition, the molded product may have a thickness in a range of 10 μm to 150 μm, and may be made of an electrically conductive material.

Meanwhile, according to another aspect of the present disclosure, there is provided a method of manufacturing a molded product, the method including: providing an anodic aluminum oxide mold made of an anodic aluminum oxide film and having openings formed by etching at least partial regions of the anodic aluminum oxide mold to correspond to a shape of molded products; forming a metal filler in each of the openings; and removing the anodic aluminum oxide mold.

Effects of Invention

The present disclosure can provide an electrically conductive contact pin, a method for manufacturing the same, an inspection apparatus, a method for manufacturing a molded product, and a molded product manufactured thereby, in which a contact pin having a vertical side surface with a sufficient height can be manufactured by using an anodic aluminum oxide mold instead of a conventional photoresist mold.

In addition, the present disclosure can provide an electrically conductive contact pin, a method for manufacturing the same, an inspection apparatus, a method for manufacturing a molded product, and a molded product manufactured thereby, in which the contact pin can be manufactured precisely and reliably even when at least a partial configuration thereof has a dimension range of equal to or less than several tens of μm compared to a conventional electrically conductive contact pin.

In addition, the present disclosure can provide an electrically conductive contact pin, a method for manufacturing the same, an inspection apparatus, a method for manufacturing a molded product, and a molded product manufactured thereby, in which the surface area of a side surface of the contact pin can be increased even when the contact pin has the same shape and dimensions as the conventional electrically conductive contact pin.

BRIEF DESCRIPTION OF DRAWINGS

FIG. 4b is a sectional view taken along line A-A' of FIG. 4a.

FIG. 5b is a sectional view taken along line A-A' of FIG. 5a.

FIG. 6b is a sectional view taken along line A-A' of FIG. 6a.

FIG. 7b is a sectional view taken along line A-A' of FIG. 7a.

DESCRIPTION OF EMBODIMENTS

Figure 1:
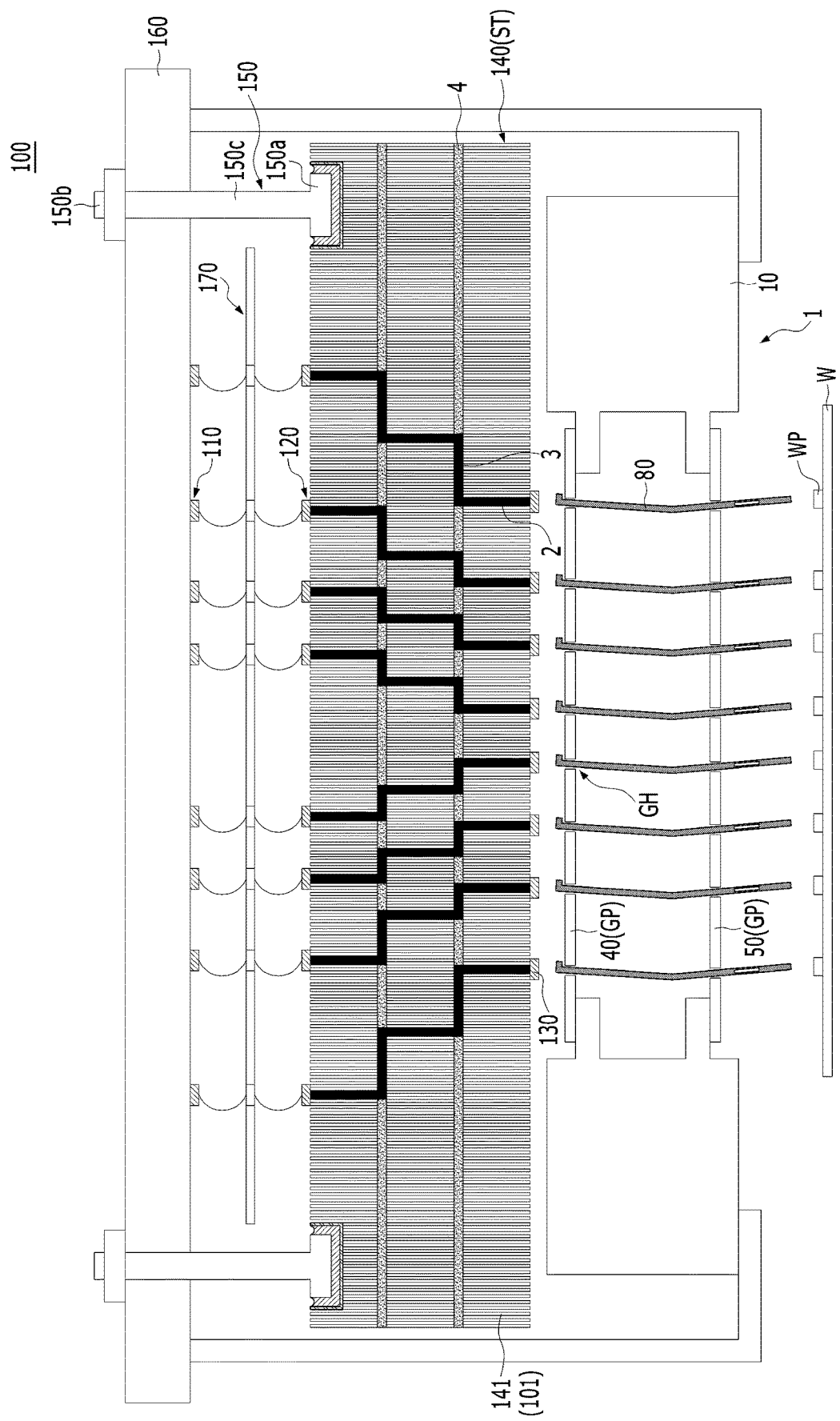
FIG. 1 is a view schematically illustrating an inspection apparatus according to an embodiment of the present disclosure.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited to the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, sizes or thicknesses of films and regions in the figures may be exaggerated. Therefore, variations from the shapes of the illustrations as a result, for example, of manufacturing techniques and/or tolerances, are to be expected. In addition, a limited number of molded products are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, exemplary embodiments of the present disclosure will be described in detail with reference to the accompanying drawings.

A molded product according to an embodiment of the present disclosure is a molded product in which at least a partial configuration constituting the shape of the molded product has a dimension range of 1 μm to 10 μm, and the dimension range of 1 μm to 10 μm of the partial configuration is a dimension range in which a design pattern is transferred and is not a dimension range formed regardless of the design pattern. The molded product has a thickness in the range of 10 μm to 150 μm, and may be made of an electrically conductive material. A method for manufacturing the molded product includes: providing an anodic aluminum oxide mold made of an anodic aluminum oxide film and having openings formed by etching at least partial regions of the anodic aluminum oxide mold to correspond to the shape of molded products; forming a metal filler in each of the openings; and removing the anodic aluminum oxide mold. Here, the molded products may be electrically conductive contact pins 80.

The electrically conductive contact pin 80 according to the embodiment of the present disclosure is different from a conventional one in that it is manufactured using an anodic aluminum oxide mold instead of a conventional photoresist mold. With this change in the type of mold, there is an effect of realizing shape precision, a fine shape, and an increase in the surface area of a side surface, which were limited in realization with the photoresist mold.

The electrically conductive contact pin 80 according to the embodiment of the present disclosure is provided in an inspection apparatus and is used to transmit electrical signals by making electrical and physical contact with an inspection object. The inspection apparatus includes the electrically conductive contact pin 80 that makes contact with the inspection object. At least a part of the contact pin 80 constituting a side surface shape thereof has a dimension range of 20 nm to 10 μm. The contact pin 80 may be provided on a side surface thereof with at least one micro-trench 89c formed long in the thickness direction of the contact pin 80 with a depth in the range of 1 μm to 10 μm, or at least one micro-convex portion 89a formed long in the thickness direction of the contact pin 80 with a height in the range of 1 μm to 10 μm. In addition, the contact pin 80 is provided on the side surface thereof with a plurality of fine trenches 88 formed long in the thickness direction of the contact pin 80 with a depth in the range of 20 nm to 1 μm. The fine trenches 88, the micro-trench 89c, and/or the micro-convex portion 89a formed on the side surface of the contact pin 80 have a dimension range of 20 nm to 10 μm.

The inspection apparatus may be an inspection apparatus used in a semiconductor manufacturing process, for example, a probe card or a test socket. However, the inspection apparatus according to the embodiment of the present disclosure is not limited thereto and includes any apparatus for checking whether an inspection object is defective by applying electricity. Hereinafter, a probe card will be described as an example of the inspection apparatus.

FIG. 1 is a view schematically illustrating a probe card 100 according to an embodiment of the present disclosure. In this figure, for convenience of description, the number and size of a plurality of contact pins 80 are illustrated exaggeratedly.

In the present disclosure, as an example, a vertical type probe card 100 is illustrated to describe a coupling structure between a connection member 140 (ST) and other peripheral parts. The type of probe card in which the coupling structure between the connection member 140 (ST) and other peripheral parts is implemented is not limited thereto, and may be a MEMS probe card and a cantilever type probe card.

A test for electrical characteristics of a semiconductor device is performed by approaching a wafer W to the probe card 100 having the plurality of contact pins 80 and then bringing the contact pins 80 into contact with corresponding electrode pads WP on the wafer W. After the contact pins 80 reach positions where the contact pins 80 are brought into contact with the electrode pads WP, the wafer W may be further lifted by a predetermined height toward the probe card 100. This may be an overdrive process.

As illustrated in FIG. 1, the probe card 100 according to the present disclosure includes the connection member 140 (ST) and a coupling member 150. The coupling member 150 may be configured as a bolt, but the type of the coupling member 150 is not limited thereto.

The connection member 140 may be configured as a space transformer ST. A circuit board 160 is provided above the space transformer 140 (ST), and a probe head 1 provided with the plurality of contact pins 80 is provided below the space transformer 140 (ST). In other words, the space transformer 140 (ST) is located between the circuit board 160 and the probe head 1. The space transformer 140 (ST) is coupled to peripheral parts by the coupling member 150.

The space transformer 140 (ST) coupled to the circuit board 160 by the coupling member 150 is electrically connected thereto by a connector 170 interposed between the circuit board 160 and the space transformer 140 (ST). Specifically, second connector connection pads 120 are provided on an upper surface of the space transformer 140 (ST), and first connector connection pads 110 are provided on a lower surface of the circuit board 160. Therefore, the connector 170 interposed between the space transformer 140 (ST) and the circuit board 160 is joined to the first connector connection pads 110 and the second connector connection pads 120 to form an electrical connection between the space transformer 140 (ST) and the circuit board 160.

An insulating part 141 of the space transformer 140 (ST) is made of an anodic aluminum oxide film 101. The anodic aluminum oxide film 101 means a film formed by anodizing a metal as a base material, and pores mean holes formed in the process of forming the anodic aluminum oxide film 101 by anodizing the metal. For example, when the metal as the base material is aluminum (Al) or an aluminum alloy, the anodization of the base material forms the anodic aluminum oxide film 101 consisting of anodized aluminum ($Al_2O_3$) on a surface of the base material. The anodic aluminum oxide film 101 has a coefficient of thermal expansion of 2 to 3 ppm/°C. With this range, the amount of deformation caused by temperature is advantageously small. In addition, since the coefficient of thermal expansion of the anodic aluminum oxide film 101 is close to that of the wafer W as an object to be inspected, positional misalignment between the contact pins 80 and the electrode pads WP can be minimized even under a high-temperature environment.

According to the present disclosure, by configuring the space transformer 140 (ST) using the anodic aluminum oxide film 101, the space transformer 140 (ST) having a small amount of thermal deformation under a high-temperature environment can be implemented. However, the material of the space transformer 140 (ST) is not limited to the anodic aluminum oxide film 101, and a ceramic material, a polyimide material, or other suitable dielectric materials may be used.

The space transformer 140 (ST) has a structure in which a plurality of layers are stacked. Specifically, vertical wiring parts 2 are provided in each of the layers of the space transformer 140 (ST), and the upper vertical wiring parts 2 and the lower vertical wiring parts 2 are electrically connected to each other through horizontal wiring parts 3. In this case, the interval between the vertical wiring parts 2 of an uppermost layer is the same as that between the second connector connection pads 120 provided on the circuit board 160, and the interval between the vertical wiring parts 2 of the plurality of layers becomes gradually narrow from the uppermost layer toward a lowermost layer. In this case, the interval between the vertical wiring parts 2 of the lowermost layer is the same as that between probe connection pads 130 provided under the space transformer 140 (ST). Therefore, the interval between the probe connection pads 130 provided under the space transformer 140 (ST) is narrower than that between the second connector connection pads 120. In other words, by providing the space transformer 140 (ST) between the circuit board 160 and the probe head 1, the plurality of contact pins 80 are arranged at a narrower interval. This means that it is possible to implement a fine pitch of the contact pins 80 through the space transformer 140 (ST).

The probe head 1 is provided below the space transformer 140 (ST). The probe head 1 supports the contact pins 80 and includes a plurality of guide plates GP having guide holes GH.

The probe head 1 has a structure in which an upper guide plate 40 and a lower guide plate 50 are sequentially provided. In this case, at least one of the upper guide plate 40 and the lower guide plate 50 is made of an anodic aluminum oxide film. The material of the upper guide plate 40 and/or the lower guide plate 50 is not limited to the anodic aluminum oxide film, and a ceramic material, a glass or silicon-based material, a polyamide material, or other suitable dielectric materials may be used. However, when configuring the upper guide plate 40 and/or the lower guide plate 50 using the anodic aluminum oxide film, the amount of deformation caused by temperature is advantageously small. In addition, since the coefficient of thermal expansion of the anodic aluminum oxide film is close to that of the wafer W as an object to be inspected, positional misalignment between the contact pins 80 and the electrode pads WP can be minimized even under a high-temperature environment.

The upper guide plate 40 and the lower guide plate 50 are supported by a spacer 10. A space through which the contact pins 80 pass is formed in the center of the spacer 10. Specifically, the upper guide plate 40 is provided in an upper mounting region formed on an upper surface of the spacer 10, and the lower guide plate 50 is provided in a lower mounting region formed on a lower surface of the spacer 10. In this case, the upper mounting region may be configured as a concave recess in the upper surface of the spacer 10, and the lower mounting region may be configured as a concave recess in the lower surface of the spacer 10. However, since the concave recess shape of the upper mounting region and the lower seating region 25 is illustrated as an example, the shape thereof is not limited thereto. Therefore, the upper mounting region and the lower mounting region may be formed in a suitable shape to allow the upper guide plate 40 and the lower guide plate 50 to be provided on the upper surface and the lower surface of the spacer 10 more stably.

A test for electrical characteristics of a semiconductor device is performed by approaching the wafer W to the probe card 100 having the plurality of contact pins 80 and then bringing the contact pins 80 into contact with the corresponding electrode pads WP on the wafer W. When bringing the contact pins 80 into contact with the electrode pads WP on the wafer W, a process of further bringing the wafer W into contact with the probe card 100 is performed after reaching a state in which the contact pins 80 and the electrode pads WP begin to make contact with each other. The contact pins 80 have a structure elastically deformable between the upper guide plate 40 and the lower guide plate 50, and these contact pins 7 are adopted to constitute the vertical type probe card 100. In a preferred embodiment of the present disclosure, the contact pins 80 are described as having a pre-deformed structure, that is, a cobra pin shape. However, the present disclosure is not limited to these examples, and a structure that deforms a straight pin can also be used.

Figure 2A:
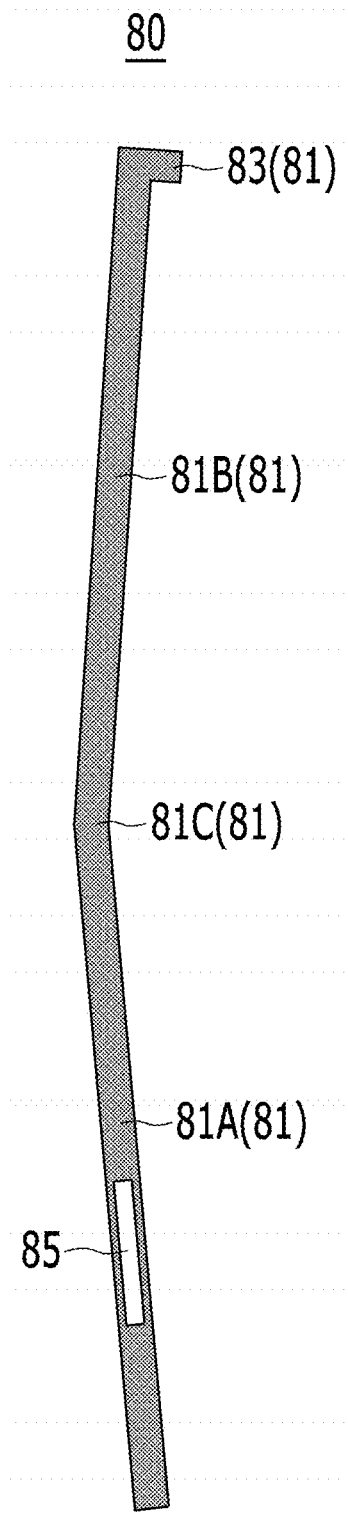
FIG. 2a is a front view illustrating a contact pin according to an embodiment of the present disclosure.
Figure 2B:
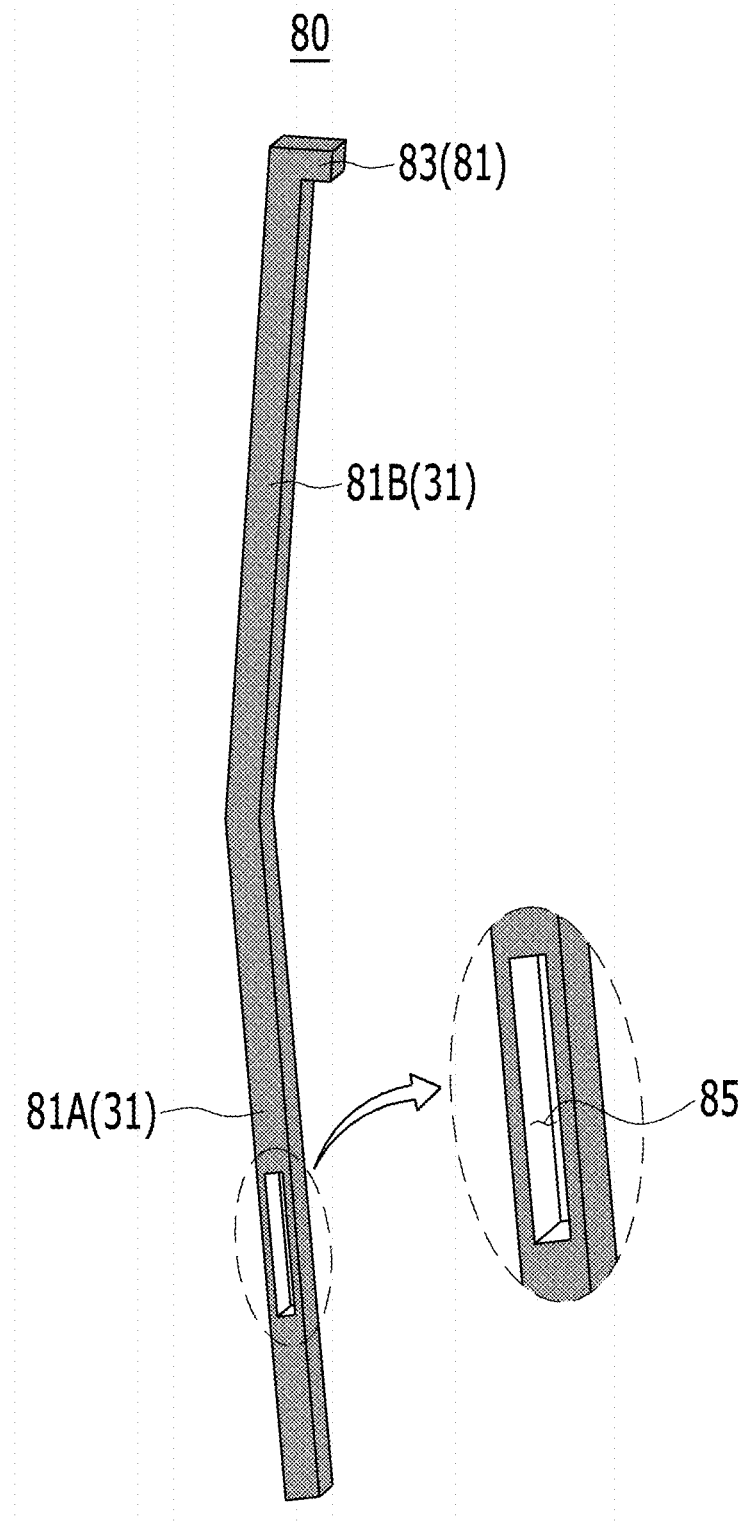
FIG. 2b is a perspective view illustrating the contact pin according to the embodiment of the present disclosure.

As illustrated in FIGS. 2a and 2b, a contact pin 80 includes a body portion 81 and a slit 85 formed in the body portion 81. The width of the body portion 81 including the width of the slit 85 may be in the range of 1 µm to 100 µm. In addition, the width of the slit 85 may be in the range of 1 µm to 100 µm. The width of the slit 85 may be in the range of several tens of µm, for example, 10 µm to 50 µm. The total length of the contact pin 80 may be in the range of 1 mm to 10 mm.

The body portion 81 includes a first body portion 81A and a second body portion 81B. The second body portion 81B is formed continuously with the first body portion 81A. The longitudinal central axis of the second body portion 81B forms an obtuse angle with the longitudinal central axis of the first body portion 81A. The body portion 81 has a bent portion at a connection point 81C of the first body portion 81A and the second body portion 81B. Referring to FIGS. 2a and 2b, the slit 85 is formed in the first body portion 81A. A specific configuration of the slit 85 will be described later. A lower end of the first body portion 81A may have a pointed shape. The pointed end shape ensures reliable scrubbing of the contact pin 80.

Figure 2C:
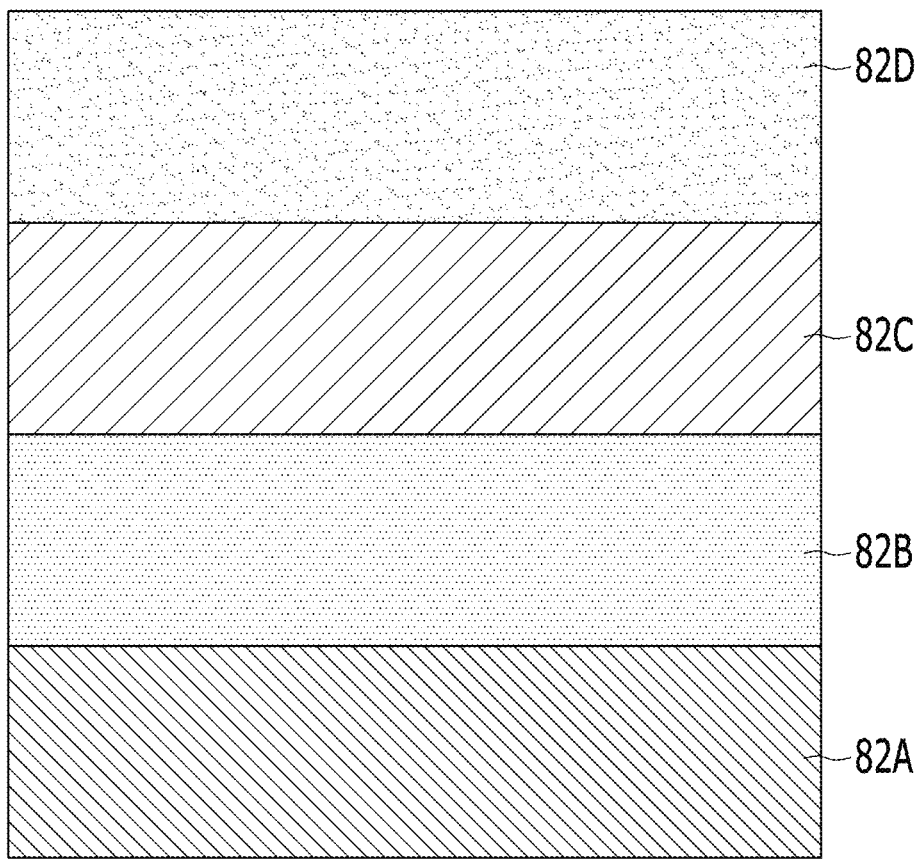
FIG. 2c is a sectional view of the contact pin according to the embodiment of the present disclosure.
Figure 2D:
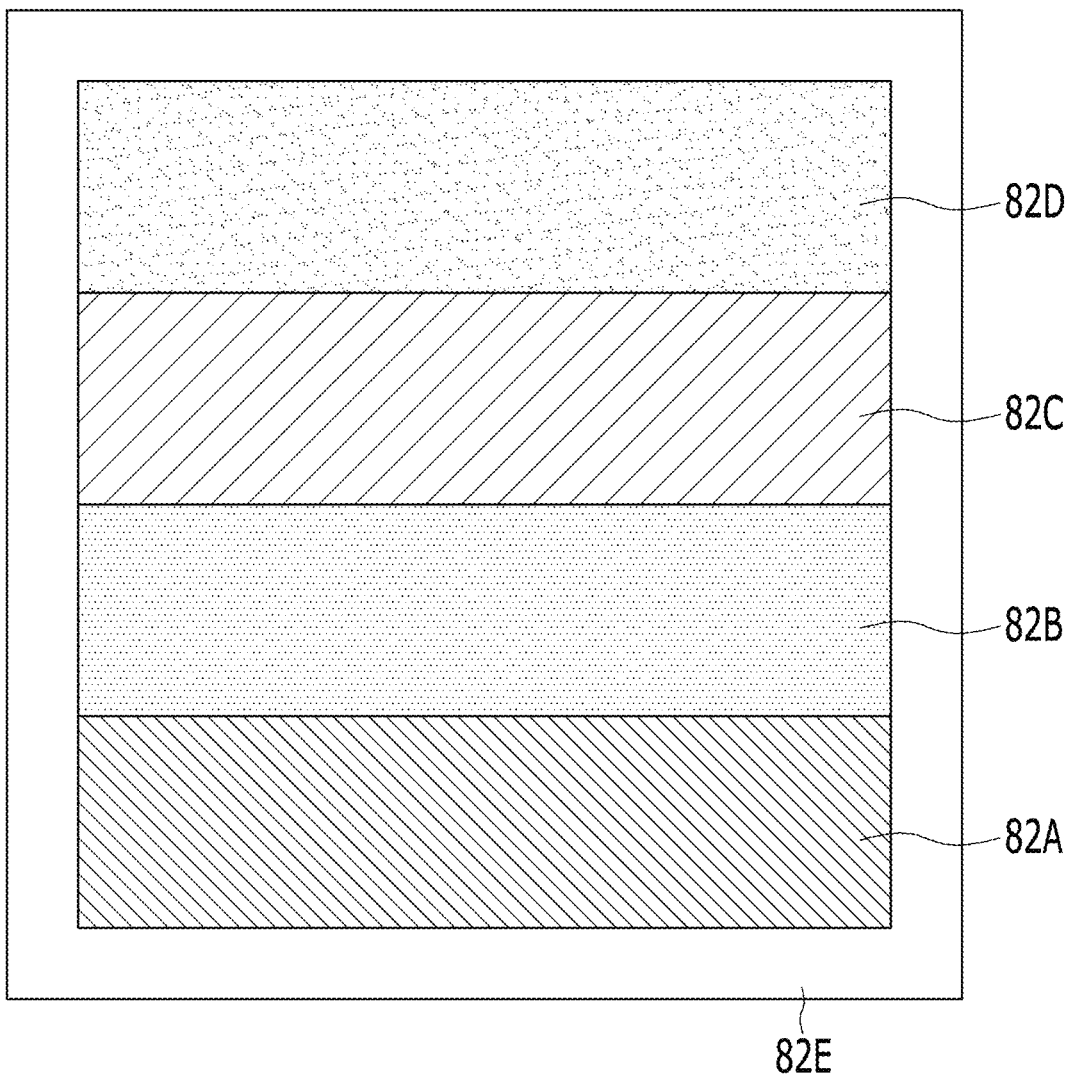
FIG. 2d is a sectional view of the contact pin according to the embodiment of the present disclosure.

FIGS. 2c and 2d are sectional views of the contact pin 80. The body portion 81 has a rectangular cross-section. In this case, the guide holes GH of the upper guide plate 40 and the lower guide plate 50 may have a rectangular cross-section corresponding to the cross-sectional shape of the body portion 81. With the configuration of the rectangular cross-section body portion 81 and the rectangular cross-section guide hole GH, the contact pin 80 can be prevented from rotating within the guide holes GH and interfering with adjacent contact pins 80, thereby realizing a narrow pitch.

The body portion 81 of the contact pin 80 may be made of a conductive material. Here, the conductive material may be at least one selected from the group consisting of platinum (Pt), rhodium (Rh), palladium (Pd), copper (Cu), silver (Ag), gold (Au), iridium (Ir), alloys of these metals, a nickel-cobalt (NiCo) alloy, a palladium-cobalt (PdCo) alloy, a palladium-nickel (PdNi) alloy, and a nickel-phosphorus (NiP) alloy. Referring to FIG. 2c, the body portion 81 of the contact pin 80 may have a multilayer structure in which a plurality of conductive materials are stacked. The conductive layers made of different materials may be each selected from the group consisting of platinum (Pt), rhodium (Rh), palladium (Pd), copper (Cu), silver (Ag), gold (Au), iridium (Ir), alloys of these metals, a palladium-cobalt (PdCo) alloy, a palladium-nickel (PdNi) alloy, and a nickel-phosphorus (NiP) alloy. As one embodiment, the body portion 81 of the contact pin 80 may have a multilayer structure in which first to fourth conductive layers are stacked. Here, the first conductive layer 82A may be made of platinum (Pt), the second conductive layer 82B may be made of rhodium (Rh), the third conductive layer 82C may be made of palladium (Pd), and the fourth conductive layer 82D may be made of a nickel-cobalt (NiCo) alloy.

Referring to FIG. 2d, the body portion 81 of the contact pin 80 may further include an outer coating layer 82E. The outer coating layer 82E may be made of a material having a higher hardness than the inner conductive materials. As one embodiment, the material of the outer coating layer 82E may be at least one selected from the group consisting of rhodium (Rh), platinum (Pt), iridium (Ir), alloys of these metals, a nickel-cobalt (NiCo) alloy, a palladium-cobalt (PdCo) alloy, a palladium-nickel (PdNi) alloy, and a nickel-phosphorus (NiP) alloy.

A method for manufacturing a molded product according to an embodiment of the present disclosure includes: providing an anodic aluminum oxide mold 200 made of an anodic aluminum oxide film and having openings 210; forming a metal filler 230 in each of the openings 210; and removing the anodic aluminum oxide mold 200 using an etchant.

Hereinafter, an anodic aluminum oxide mold capable of manufacturing a molded product, for example, a contact pin 80, and a manufacturing method using the same according to an embodiment of the present disclosure will be described with reference to FIGS. 3a to 3c.

The anodic aluminum oxide mold 200 described below includes not only those in which the openings 210 are formed, but also those in a state before the openings 210 are formed. The anodic aluminum oxide mold 200 is made of an anodic aluminum oxide film and has the openings 210 formed therein. In addition, the anodic aluminum oxide mold 200 includes an island 250 provided inside each of the openings 210 and made of the anodic aluminum oxide film. The anodic aluminum oxide mold 200 is a mold in which the metal filler 230 is provided in each of the openings 210 to form contact pins 80.

Figure 3A:
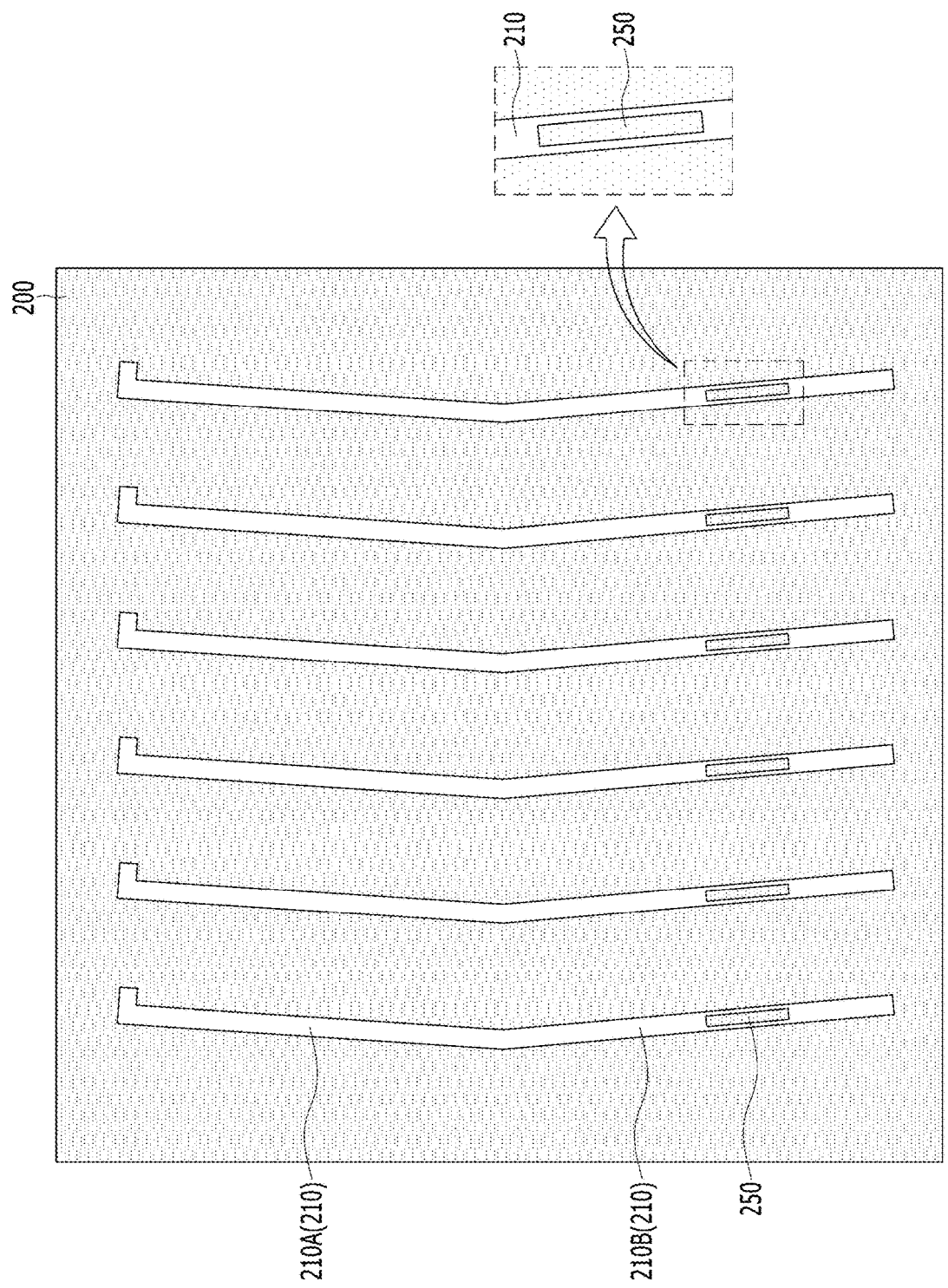
FIG. 3a is a plan view illustrating an anodic aluminum oxide mold with openings according to an embodiment of the present disclosure.

Referring to FIG. 3a, the anodic aluminum oxide mold 200 is made of the anodic aluminum oxide film and has the openings 210 formed therein. The anodic aluminum oxide mold 200 is formed by anodizing a metal base material. An island 250 made of the anodic aluminum oxide film is provided inside each of the openings 210. The island 250 is an area where the anodic aluminum oxide film remains without being removed when the opening 210 is formed by etching a portion of the anodic aluminum oxide mold 200, and is an anodic aluminum oxide film area surrounded by the opening 210. The anodic aluminum oxide mold 200 may have a thickness in the range of 50 μm to 100 μm.

The openings 210 may be formed by etching the anodic aluminum oxide mold 200. To this end, a photoresist may be provided on an upper surface of the anodic aluminum oxide mold 200 and patterned, and then the anodic aluminum oxide film in patterned and open areas may react with an etchant to form the openings 210. In detail, after a photosensitive material is provided on the upper surface of the anodic aluminum oxide mold 200 in a state before the openings 210 are formed, an exposure process may be performed. At least portions of the photosensitive material may be patterned and removed by the exposure process. Here, the photoresist remains on the areas that will later become islands 250 without being removed. As a result of etching the anodic aluminum oxide mold 200 through the areas where the photosensitive material is removed by the patterning process, the anodic aluminum oxide film around the areas that will later become the islands 250 is removed by the etchant to form the openings 210.

The shape of the openings 210 and the islands 250 may be determined according to the shape of a pattern resulting from patterning the photosensitive material provided on the upper surface of the anodic aluminum oxide mold 200. The photosensitive material is not limited in dimensions and shapes of the areas to be patterned. Therefore, since the openings 210 and the islands 250 are formed by patterning the photosensitive material and etching the anodic aluminum oxide mold 200 through the areas removed by the patterning process, there is no limitation on the dimensions and shapes of the openings 210 and islands 250. The opening 210 forms the body portion 81 of the contact pin 80 later. Since the opening 210 and the island 250 are formed through the etching of the anodic aluminum oxide film as described above, the width of the body portion 81 including the width of the slit 85 may be in the range of 1 μm to 100 μm, the width of the slit 85 may be in the range of 1 μm to 100 μm, more preferably 5 μm to 30 μm, and the total length of the contact pin 80 may be in the range of 1 mm to 10 mm.

An opening formed by a processing method using a laser or drill mainly has a circular cross-section or is formed in a shape that does not include a corner where surfaces meet. In addition, since the processing method using the laser or drill is difficult to form minute holes, and holes have to be formed at pitches P considering mechanical errors, there are limitations on their dimension and shape. However, according to the embodiment of the present disclosure, the opening 210 may have an angled corner, and the opening 210 can be formed without limiting its shape.

In addition, when the anodic aluminum oxide mold 200 is wet-etched with an etchant, openings 210 having vertical inner walls are formed. Therefore, the body portion 81 of the contact pin 80 has a rectangular longitudinal section.

The anodic aluminum oxide mold 200 may be formed with a thickness in the range of 10 μm to 150 μm. In the case of using a photoresist mold instead of the anodic aluminum oxide mold 200, it is difficult to precisely and quickly manufacture openings having vertical side surfaces because the openings have to be formed in a thick photoresist through an exposure process. This method has limitations on increasing the thickness of the photoresist mold to equal to or greater than 70 μm. On the other hand, when the openings 210 are formed using the anodic aluminum oxide mold 200, the openings 210 having the vertical side surfaces can be formed precisely and quickly even when the thickness of the anodic oxide mold 200 is equal to or greater than 70 μm.

Figure 3B:
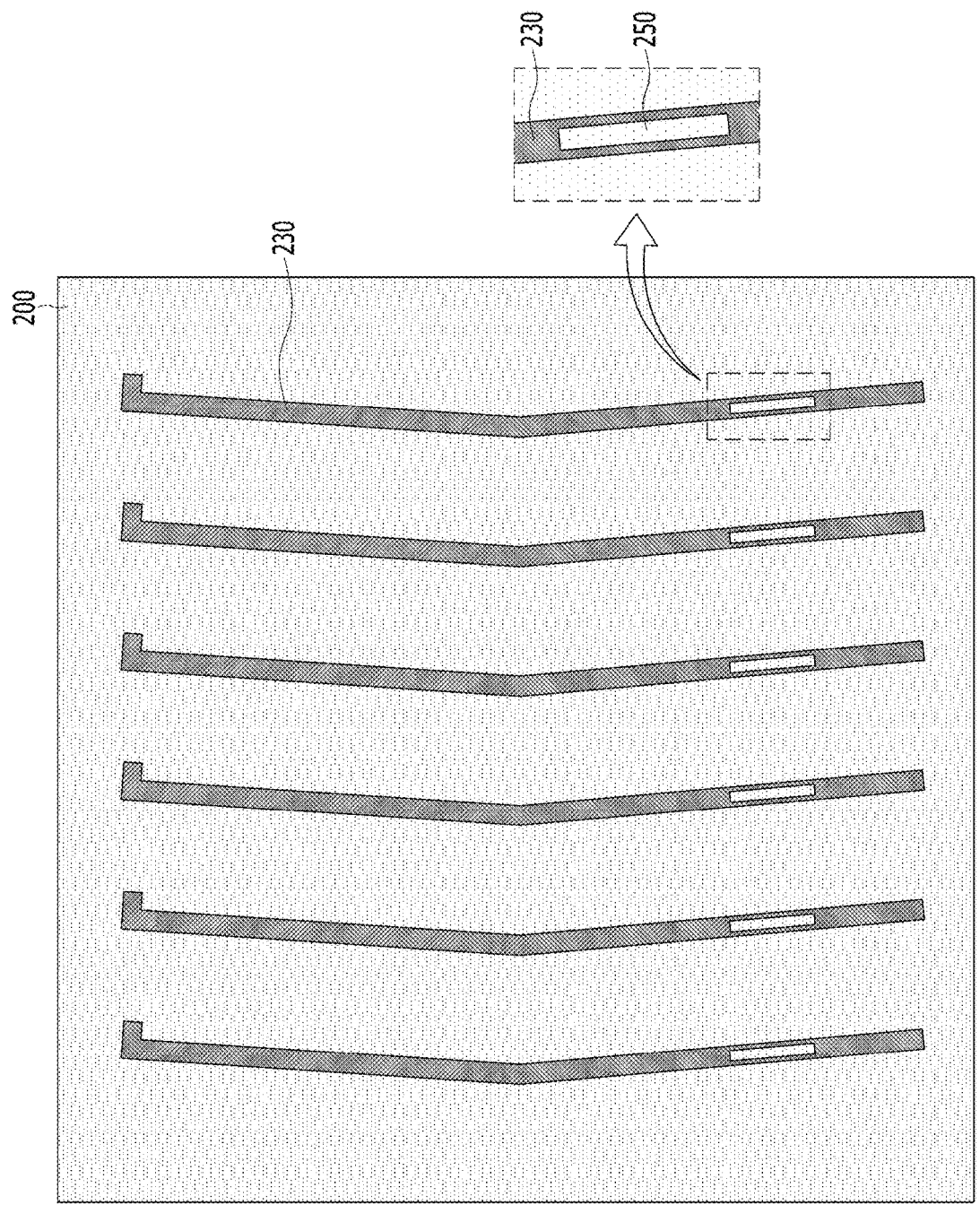
FIG. 3b is a plan view illustrating the anodic aluminum oxide mold in which metal fillers are provided in the openings according to the embodiment of the present disclosure.

Referring to FIG. 3b, the metal filler 230 is provided in each of the openings 210 of the anodic aluminum oxide mold 200. When the metal filler 230 fills each of the openings 210, the island 250 is surrounded by the metal filler 230.

Figure 3C:
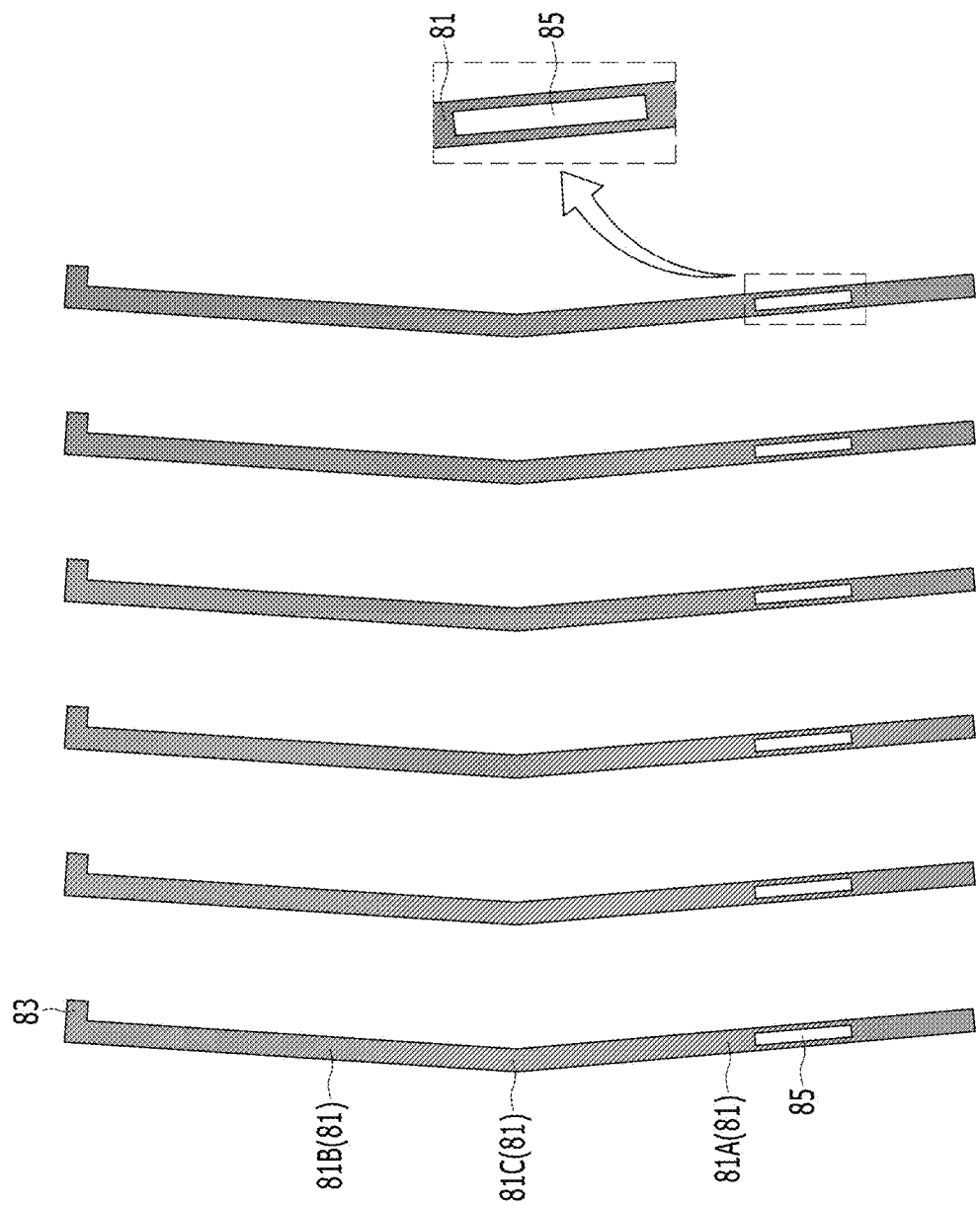
FIG. 3c is a front view illustrating contact pins after the anodic aluminum oxide mold illustrated in FIG. 3b is removed.

Referring to FIG. 3c, molded products are completed by removing the anodic aluminum oxide mold 200. Here, the molded products may be contact pins 80. Since the islands 250 are also removed when the anodic aluminum oxide mold 200 is removed, each of the contact pins 80 has the slit 85. The removal of the anodic aluminum oxide mold 200 including the islands 250 may be performed through wet etching using an etchant.

Hereinafter, a mold structure 500 capable of manufacturing a molded product, for example, a contact pin 80, and a manufacturing method using the same according to an embodiment of the present disclosure will be described.

The mold structure 500 includes an anodic aluminum oxide mold 200 made of an anodic aluminum oxide film and having openings 210, and a support member 400, 410, 600 provided under the anodic aluminum oxide mold 200. The mold structure 500 includes a metal layer 300, 310, 330 between the anodic aluminum oxide mold 200 and the support member 400, 410, 600. The metal layer 300, 310, and 330 may be exposed through the openings 210. The metal layer 300, 310, 330 may be used as a plating seed layer of a metal filler 230 formed in each of the openings 210.

A method for manufacturing a molded product using the mold structure 500 includes: providing the anodic aluminum oxide mold 200 made of an anodic aluminum oxide film and having the openings 210; forming the metal filler 230 in each of the openings 210; and removing the anodic aluminum oxide mold 200. Here, the forming of the openings 210 includes performing plating using the metal layer 300, 310, 330 provided under the anodic aluminum oxide mold 200 and exposed through the openings 210 as a seed layer.

Hereinafter, a mold structure 500 capable of manufacturing a molded product, for example, a contact pin 80, and a manufacturing method using the same according to an embodiment of the present disclosure will be described with reference to FIGS. 4a to 7b.

Figure 4A:
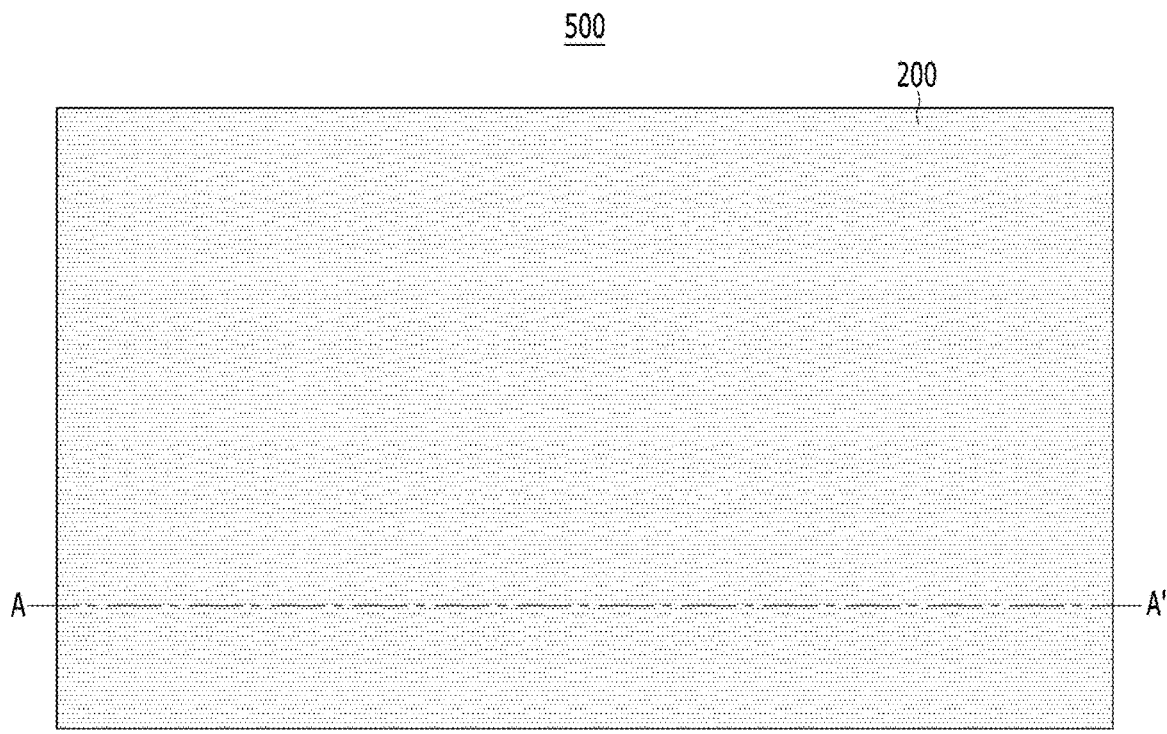
FIG. 4a is a plan view illustrating a mold structure according to an embodiment of the present disclosure.
Figure 4B:
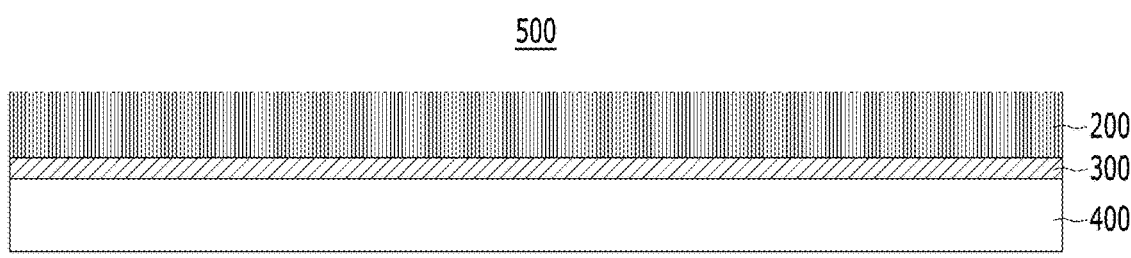

Referring to FIGS. 4a and 4b, FIG. 4a is a plan view of the mold structure 500 in a state before openings 210 are formed, and FIG. 4b is a sectional view taken along line A-A' of FIG. 4a. The mold structure 500 includes an anodic aluminum oxide mold 200 made of an anodic aluminum oxide film and a support member 400 provided under the anodic aluminum oxide mold 200. In addition, the mold structure 500 includes the metal layer 300 provided between the anodic aluminum oxide mold 200 and the support member 400.

The support member 400 is a configuration employed to support the anodic aluminum oxide mold 200 to maintain flatness, and may be glass, silicon, ceramic, glass-ceramic, or metal. However, the material of the support member 400 is not limited thereto and may include any material capable of maintaining flatness while supporting the anodic aluminum oxide mold 200.

A metal layer 300 is provided on the support member 400. The metal layer 300 may be made of a material that can be anodized or electroplated. The metal layer 300 may be a single metal or an alloy, and may be, for example, a single metal selected from the group consisting of copper (Cu), aluminum (Al), magnesium (Mg), titanium (Ti), zinc (Zn), niobium (Nb), and tantalum (Ta) or an alloy including one or more selected metals.

A seed layer (not illustrated) is provided under the metal layer 300. The seed layer (not illustrated) may be made of titanium or chromium and may be formed by sputtering or the like. As one embodiment, the metal layer 300 may be formed by forming a chromium sputtering film with a thickness of 50 nm and then stacking a copper (Cu) sputtering film with a thickness of 100 nm on the chromium sputtering film.

The anodic aluminum oxide mold 200 is provided on the metal layer 300. The anodic aluminum oxide mold 200 is formed by anodizing a metal base material. Here, the metal base material may be the metal layer 300. In other words, the anodization of the metal layer 300 forms the anodic aluminum oxide mold 200 made of the anodic aluminum oxide film is formed on top of the metal layer 300. The anodic aluminum oxide mold 200 may have a thickness in the range of 50 μm to 100 μm.

Meanwhile, the anodic aluminum oxide mold 200 may be provided on a metal layer 300 manufactured separately from the metal layer 300 through a separate manufacturing process. In the separate manufacturing process, an anodic aluminum oxide mold 200 may be produced by anodizing a metal base material to form an anodic aluminum oxide film and then removing the metal base material. The anodic aluminum oxide mold 200 thus produced may be provided on the metal layer 300. In this case, the metal layer 300 may be made of a material that can be electroplated for subsequent processes.

Figure 5A:
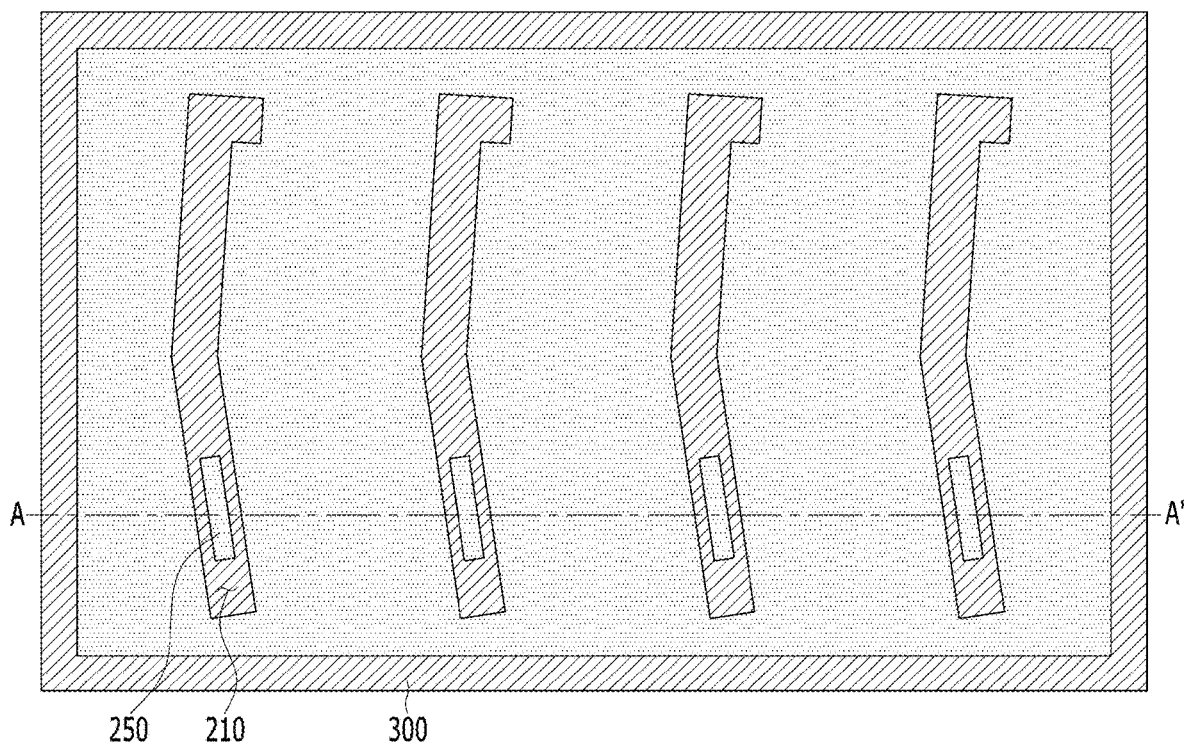
FIG. 5a is a plan view illustrating a mold structure with openings according to an embodiment of the present disclosure.
Figure 5B:
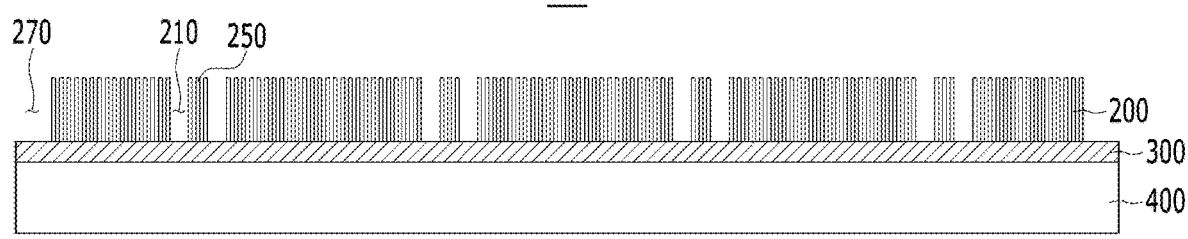

Referring to FIGS. 5a and 5b, FIG. 5a is a plan view of the mold structure 500 in which the openings 210 are formed, and FIG. 5b is a sectional view taken along line A-A' of FIG. 5a.

After a photosensitive material is provided on an upper surface of the anodic aluminum oxide mold 200 illustrated in FIGS. 4a and 4b, an exposure process may be performed. At least portions of the photosensitive material may be patterned and removed by a patterning process. The anodic aluminum oxide mold 200 is etched through the areas where the photosensitive material is removed by the patterning process. Through the above process, the anodic aluminum oxide mold 200 having the openings 210 illustrated in FIGS. 5a and 5b is obtained. The shape of the openings 210 is the same as that of contact pins 80 to be manufactured.

The openings 210 are formed by etching the anodic aluminum oxide mold 200. To this end, a photoresist may be provided on the upper surface of the anodic aluminum oxide mold 200 and patterned, and then the anodic aluminum oxide film in patterned and open areas may react with an etchant to form the openings 210. In detail, after the photosensitive material is provided on the upper surface of the anodic aluminum oxide mold 200 in a state before the openings 210 are formed, an exposure process may be performed. At least portions of the photosensitive material may be patterned and removed by the exposure process. Here, the photoresist remains on the areas that will later become islands 250 without being removed. As a result of etching the anodic aluminum oxide mold 200 through the open areas where the photosensitive material is removed by the patterning process, the anodic aluminum oxide film around the areas that will later become the islands 250 is removed by the etchant to form the openings 210.

Although only four openings 210 are illustrated in FIGS. 5a and 5b, tens to hundreds of thousands of openings 210 can be formed simultaneously through a single etching process, which enables efficient production compared to a processing method using a laser or drill. In addition, while it is difficult to obtain vertical side surfaces of the openings 210 when using a photoresist or silicon wafer as a mold and high cost is required when using deep reactive-ion etching (DRIE), the process of forming the openings 210 through the etching of the anodic aluminum oxide film is effective in obtaining vertical side surfaces at low cost.

During the etching process, at least a portion of the anodic aluminum oxide mold 200 is removed to form a margin space 270. The margin space 270 may preferably be provided on the outside of the mold structure 500, and more preferably be provided on an outer edge of the mold structure 500. An upper surface of the metal layer 300 is exposed through the margin space 270. The margin space 270 serves as a connection area for a plating electrode in a subsequent electroplating process.

Figure 10:
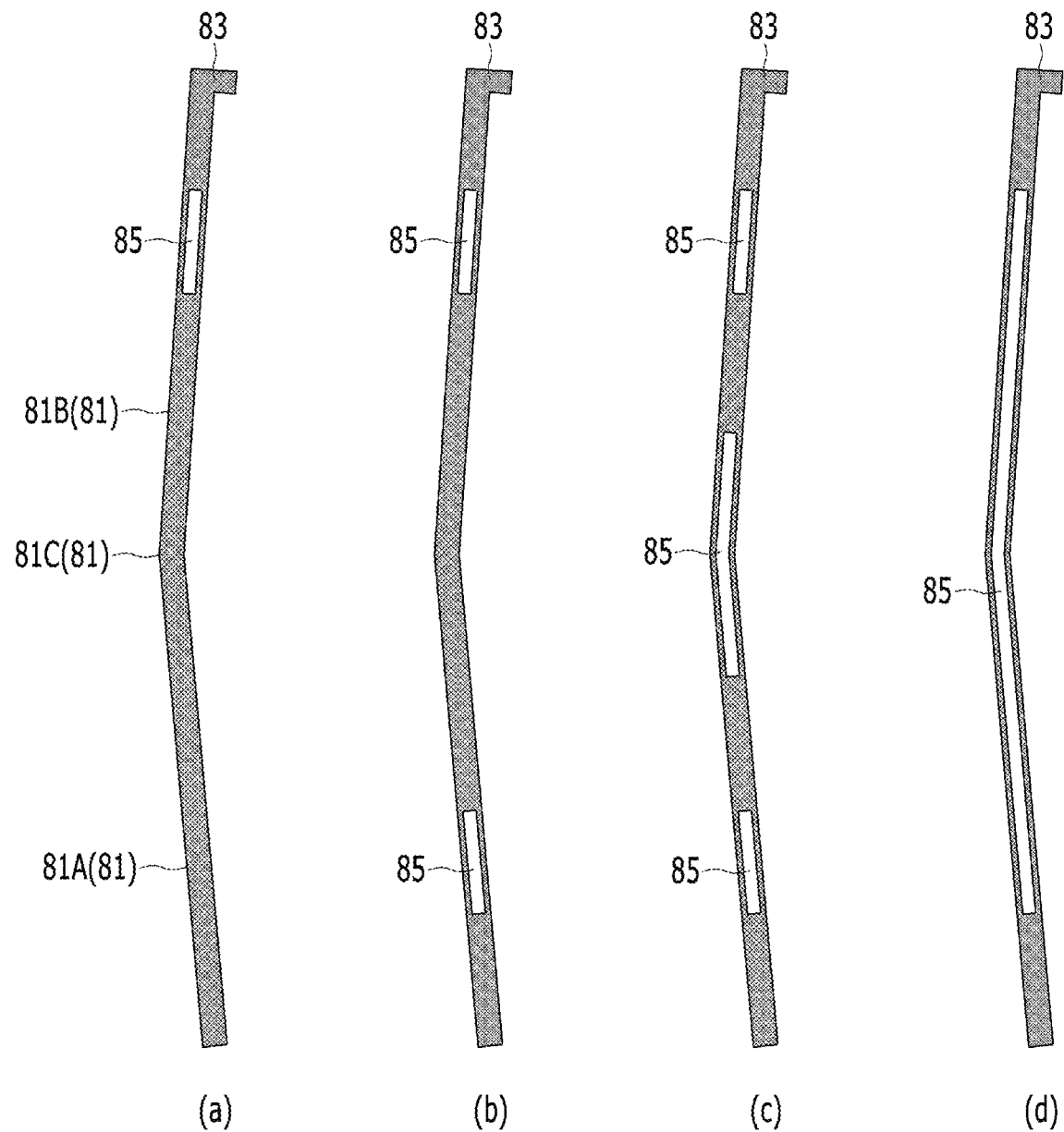
FIGS. 10 to 12 are views illustrating various modified examples of the contact pin according to the embodiment of the present disclosure.

An island 250 made of the anodic aluminum oxide film is provided inside each of the openings 210. The island 250 is an area where the anodic aluminum oxide film remains without being removed when the opening 210 is formed by etching a portion of the anodic aluminum oxide mold 200. The island 250 is removed from a final molded product to become a slit 85. The configuration of the slit 85 formed in the final molded product may be the same as that of the island 250. Here, the configuration of the opening 210 will be described with reference to FIGS. 10 to 12. Referring to FIG. 10, the island 250 may be formed in a second opening 210B. Alternatively, the island 250 may be formed in each of a first opening 210A and the second opening 210B. Alternatively, the island 250 may be formed at a connection point of the first opening 210A and the second opening 210B. Alternatively, the island 250 may be continuously formed in the first opening 210A and the second opening 210B. Meanwhile, referring to FIG. 11, a plurality of islands 250 may be provided in the width direction of the opening 210. For example, two islands 250 may be formed side by side in each of the first opening 210A and the second opening 210B. Alternatively, a plurality of islands 250 may be provided such that projection areas between at least two islands 250 overlap each other. Alternatively, a plurality of islands 250 may be provided to have different lengths, and at least one of the islands 250 may be continuously formed in the first opening 210A and the second opening 210B. Alternatively, the number of islands 250 formed in the first opening 210A and the number of islands 250 formed in the second opening 210B may be different, and the islands 250 may have different widths. In addition, referring to FIG. 12, the island 250 may have a round shape. The island 250 may have a round shape and may be provided in the first opening 210A or the second opening 210B. Alternatively, the island 250 may have a round shape and may be continuously formed in the first opening 210A and the second opening 210B. Alternatively, the island 250 may have a circular shape, and a plurality of circular islands 250 of a may be provided in the first opening 210A and/or the second opening 210B. Alternatively, the island 250 may be formed in a sine wave shape or a "W" shape.

Figure 6A:
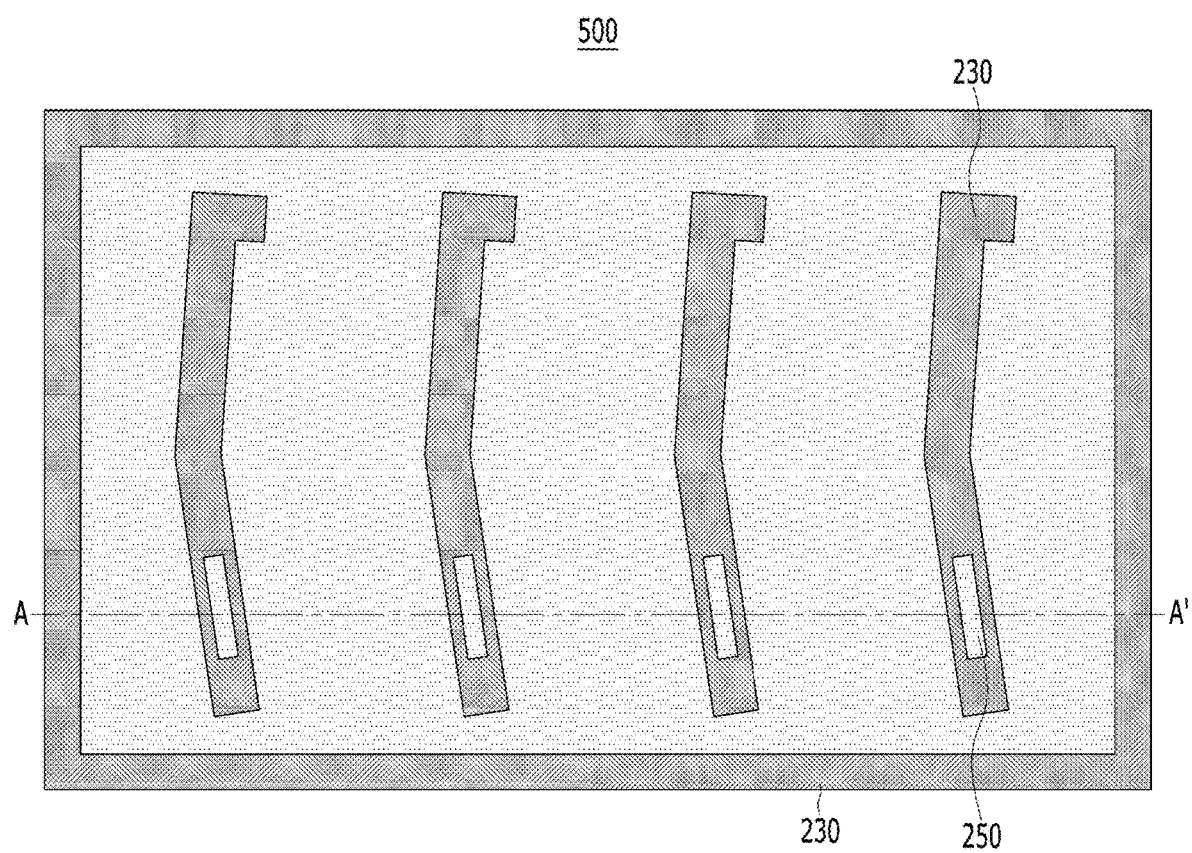
FIG. 6a is a plan view illustrating the mold structure in which metal fillers are provided in the openings according to the embodiment of the present disclosure.
Figure 6B:
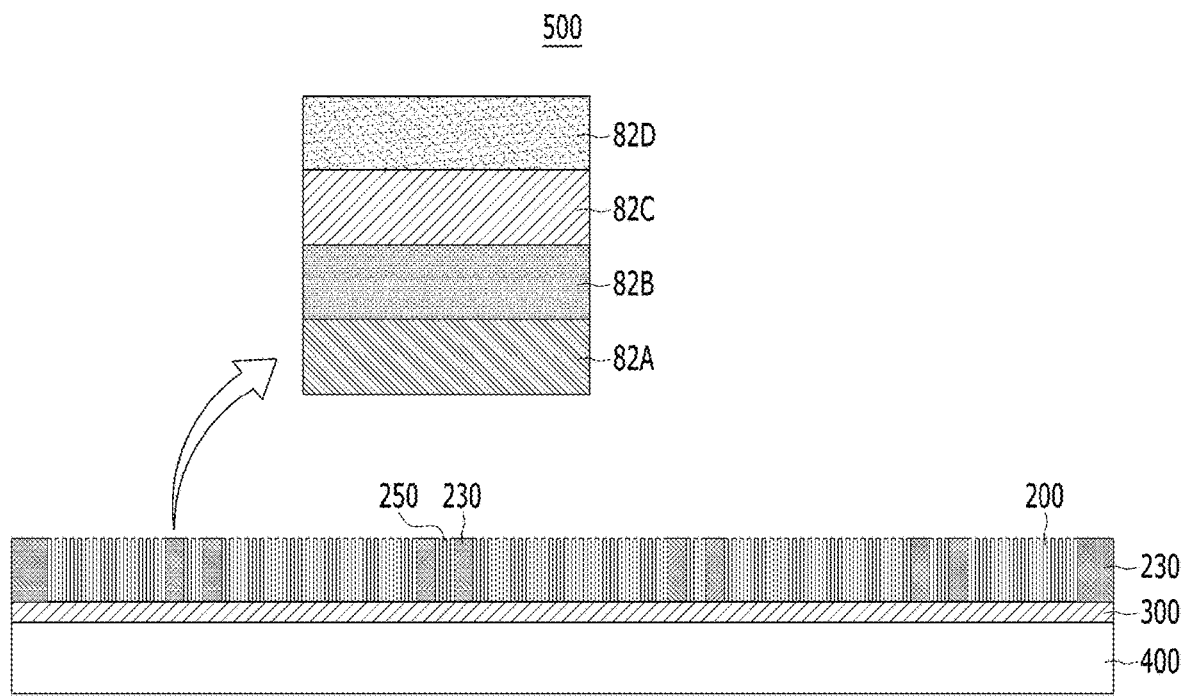

Referring to FIGS. 6a and 6b, FIG. 6a is a plan view of the mold structure 500 in which the metal filler 230 is formed in each of the openings 210, and FIG. 6b is a sectional view taken along line A-A' of FIG. 6a.

Electroplating may be performed by connecting a plating electrode to the upper surface of the metal layer 300 exposed through the margin space 270. As a result of the electroplating using the metal layer 300 as a power feed layer, the metal filler 230 is deposited on the metal layer 300 within each of the openings 210. Through the above process, the metal filler 230 can be formed uniformly without excess plating on the anodic aluminum oxide mold 200.

Here, the metal filler 230 formed through the electroplating may be at least one selected from the group consisting of platinum (Pt), rhodium (Rh), palladium (Pd), copper (Cu), silver (Ag), gold (Au), iridium (Ir), alloys of these metals, a nickel-cobalt (NiCo) alloy, a palladium-cobalt (PdCo) alloy, a palladium-nickel (PdNi) alloy, and a nickel-phosphorus (NiP) alloy.

The metal filler 230 may have a multilayer structure in which a plurality of conductive layers are stacked. The conductive layers of the metal filler 200 made of different materials may be each selected from the group consisting of platinum (Pt), rhodium (Rh), palladium (Pd), copper (Cu), silver (Ag), gold (Au), iridium (Ir), alloys of these metals, a palladium-cobalt (PdCo) alloy, a palladium-nickel (PdNi) alloy, and a nickel-phosphorus (NiP) alloy.

The metal filler 230 may have a multilayer structure in which first to fourth conductive layers are stacked. The metal filler 230 may be formed by sequentially plating the first to fourth conductive layers. As such, the different conductive materials may be sequentially plated without changing the anodic aluminum oxide mold 200. As one embodiment, the first conductive layer 82A may be made of platinum (Pt), the second conductive layer 82B may be made of rhodium (Rh), the third conductive layer 82C may be made of palladium (Pd), and the fourth conductive layer 82D may be made of a nickel-cobalt (NiCo) alloy.

After the plating process is completed, a planarization process may be performed. The metal filler 230 protruding from the upper surface of the anodic aluminum oxide mold 200 is removed through a chemical mechanical polishing (CMP) process. Here, a portion of the upper surface of the anodic aluminum oxide mold 200 including the metal filler 230 is removed in consideration of a designed thickness of the contact pin 80.

Figure 7A:
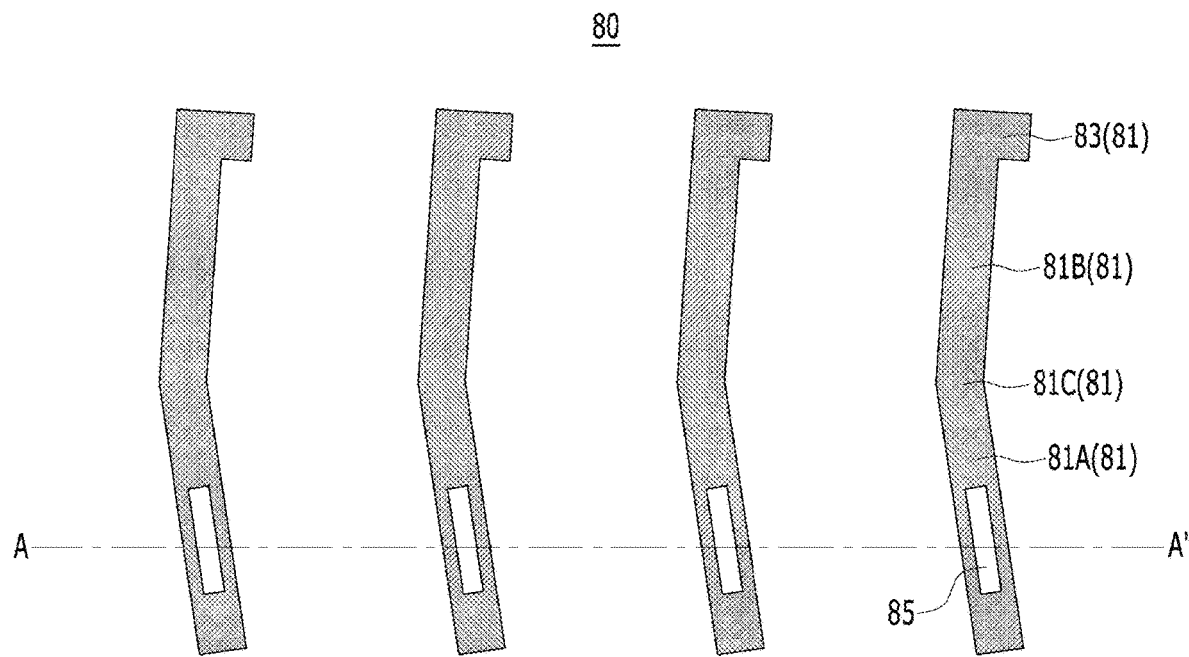
FIG. 7a is a front view illustrating contact pins after the mold structure is removed.
Figure 7B:

Referring to FIGS. 7a and 7b, FIG. 7a is a plan view of molded products after the mold structure 50 is removed, and FIG. 7b is a sectional view taken along line A-A' of FIG. 7a. After the planarization process is completed, the anodic aluminum oxide mold 200 made of the anodic aluminum oxide film is removed using an etchant. When the anodic aluminum oxide mold 200 is removed, the islands 250 are also removed by the etchant, and slits 85 are formed where the islands 250 are removed.

Thereafter, the metal layer 300 is removed using an etchant dedicated to the metal layer 300 to separate the molded products and the support member 400. Here, the molded products may be contact pins 80. Thereafter, an outer coating layer 82E is further formed on a body portion 81 of each of the contact pins 80. The outer coating layer 82E may be made of a material having a higher hardness than the inner conductive materials.

Hereinafter, a mold structure 500 capable of manufacturing a molded product, for example, a contact pin 80, and a manufacturing method using the same according to an embodiment of the present disclosure will be described with reference to FIG. 8.

Figure 8:
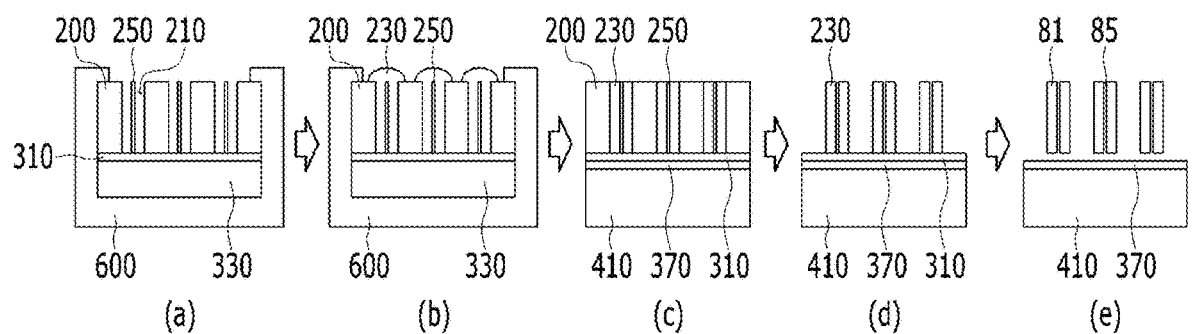
FIG. 8 is a view illustrating a method for manufacturing a molded product according to an embodiment of the present disclosure.

As illustrated in FIG. 8, a support member provided under an anodic aluminum oxide mold 200 includes a first support member 600 provided under the anodic aluminum oxide mold 200 in an electroplating process to support the anodic aluminum oxide mold 200, and a second support member 410 provided under the anodic aluminum oxide mold 200 in a planarization process to support the anodic aluminum oxide mold 200.

Referring to FIG. 8(a), metal layers 310 and 330 are provided on an upper surface of the first support member 600. The metal layers 310 and 330 include a first metal layer 310 provided under the anodic aluminum oxide mold 200 and a second metal layer 330 provided on the upper surface of the first support member 600. The first metal layer 310 made of a metal material is provided under the anodic aluminum oxide mold 200. More preferably, the first metal layer 310 made of a metal material is provided on a surface of a barrier layer formed during the manufacture of the anodic aluminum oxide mold 200. The first metal layer 310 is preferably made of copper (Cu) or platinum (Pt), but is not limited thereto as long as it is a material that can be electroplated. The second metal layer 330 is provided on an upper surface of a concave portion of the first support member 600 and is preferably made of copper (Cu) effective for electroplating, but is not limited thereto. The first metal layer 310 provided on the surface of the anodic aluminum oxide mold 200 may be provided before mounting the anodic aluminum oxide mold 200 to the first support member 600, and the second metal layer 330 provided on the first support member 600 may also be provided before mounting the anodic aluminum oxide mold 200 to the first support member 600. Preparation for electroplating is completed by placing the anodic aluminum oxide mold 200 provided with the first metal layer 310 on an upper surface of the second metal layer 330 provided on the first support member 600, and then fixing the anodic aluminum oxide mold 200 to the first support member 600. Here, a part of the upper surface of the anodic aluminum oxide mold 200 is clamped by a clamping part provided on the first support member 600 so that the anodic aluminum oxide mold 200 can be fixed without shaking.

The anodic aluminum oxide mold 200 is made of an anodic aluminum oxide film and has openings 210 formed therein. The anodic aluminum oxide mold 200 is formed by anodizing a metal base material. An island 250 made of the anodic aluminum oxide film is provided inside each of the openings 210. The island 250 is an area where the anodic aluminum oxide film remains without being removed when the opening 210 is formed by etching a portion of the anodic aluminum oxide mold 200, and is an anodic aluminum oxide film area surrounded by the opening 210. The anodic aluminum oxide mold 200 may have a thickness in the range of 10 μm to 150 μm.

Then, as illustrated in FIG. 8(b), electroplating is performed using the metal layers 310 and 330. A metal filler 230 fills each of the openings 210 of the anodic aluminum oxide mold 200, except for the island 250, from the bottom of the opening 210 to the top of the opening 210.

After the electroplating is completed, as illustrated in FIG. 8(c), the anodic aluminum oxide mold 200 is separated from the first support member 600 and placed on an upper surface of the second support member 410, and then planarization is performed. In this case, when the anodic aluminum oxide mold 200 is separated from the first support member 600, the first metal layer 310 under the anodic aluminum oxide mold 200 is also separated from the first support member 600. A bonding layer 370 is provided on the upper surface of the second support member 410. The anodic aluminum oxide mold 200 can be fixed to the second support member 410 without shaking through the bonding layer 370. The metal filler 230 protruding from the upper surface of the anodic aluminum oxide mold 200 is then removed through a chemical mechanical polishing (CMP) process. Here, a portion of the upper surface of the anodic aluminum oxide mold 200 including the metal filler 230 is removed in consideration of a designed thickness of the contact pin 80.

Then, as illustrated in FIG. 8(d), only the anodic aluminum oxide mold 200 is removed using an etchant that selectively reacts to the anodic aluminum oxide mold 200 without reacting to the first metal layer 310 and the bonding layer 370. At this time, the island 250 is also removed by the etchant.

Then, as illustrated in FIG. 8(e), the first metal layer 310 is removed using an etchant that selectively reacts to the first metal layer 310, thereby completing the manufacture of molded products. Each of the molded products (contact pins) thus manufactured includes a body portion 81 and a slit 85 formed in the body portion 81.

Figure 9A:
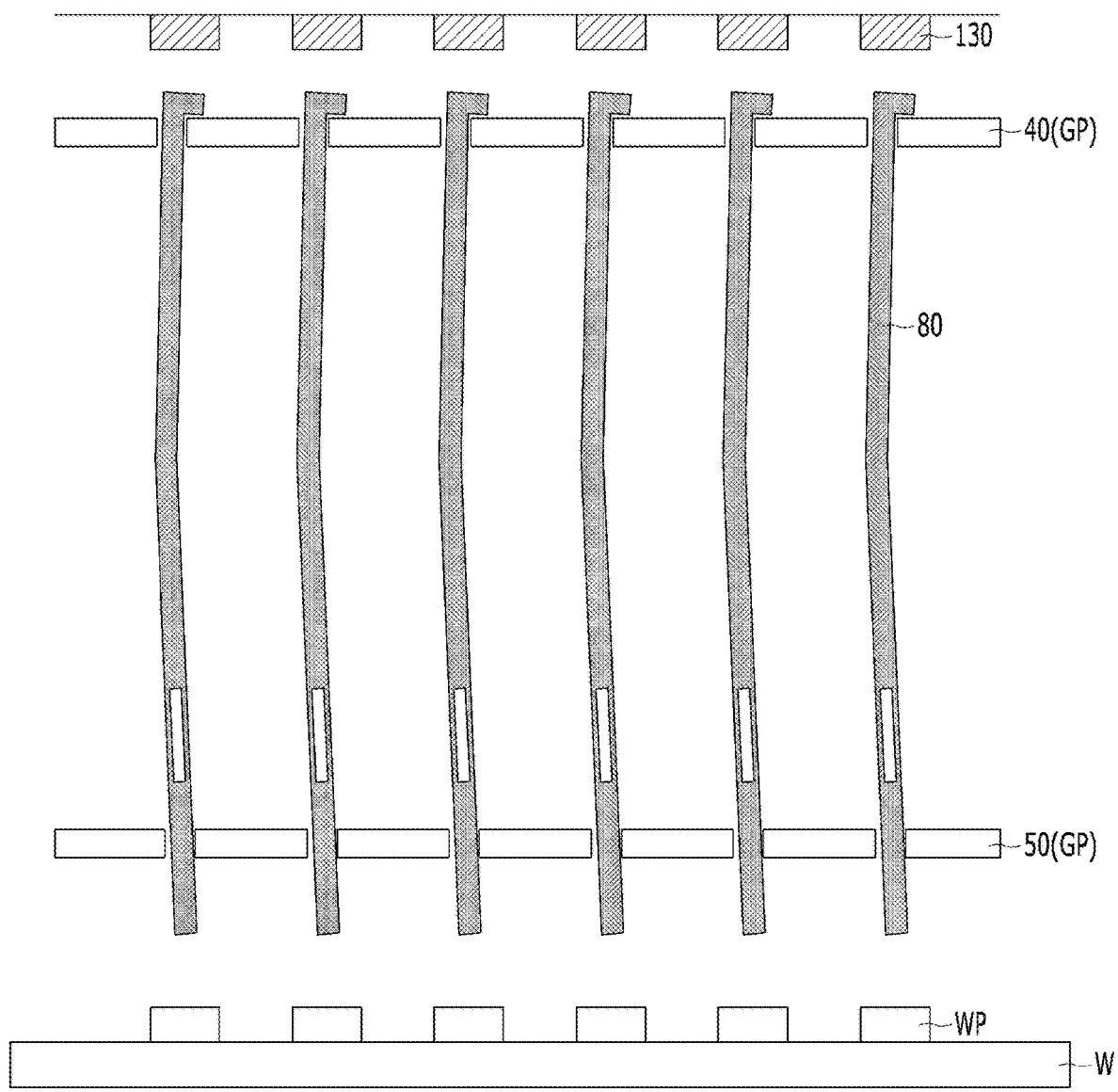
FIG. 9a is a view illustrating a probe head provided with contact pins according to an embodiment of the present disclosure before contact with a wafer.
Figure 9B:
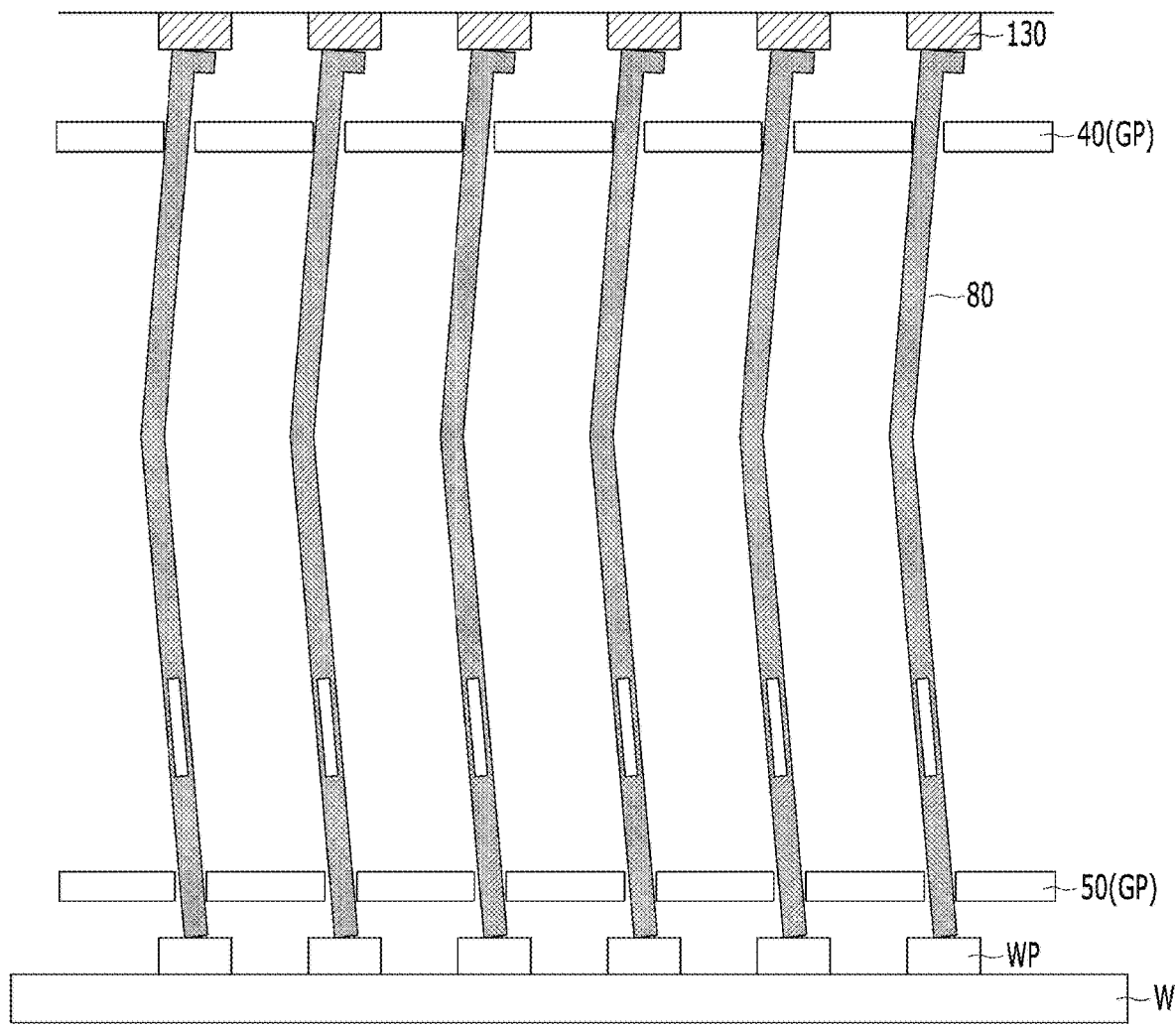
FIG. 9b is a view illustrating the probe head provided with contact pins according to the embodiment of the present disclosure after contact with the wafer.

FIGS. 9a and 9b illustrate that a plurality of contact pins 80 manufactured according to the embodiment of the present disclosure are inserted into the guide holes GH of the upper guide plate 40 and the lower guide plate 50 to constitute the probe head 1.

Referring to FIG. 9a, each of the contact pins 80 includes the body portion 81 and the slit 85 formed in the body portion 81. The width of the slit 85 is in the range of 1 μm to 100 μm, more preferably 5 μm to 30 μm. The body portion 81 is composed of the first body portion 81A inserted into the lower guide plate 50 and the second body portion 81B inserted into the upper guide plate 40. The first body portion 81A of the body portion 81 has a protrusion 83 at an end thereof. The protrusion 83 is caught on an upper surface of the upper guide plate 40 to prevent the contact pin 80 from escaping out of the guide hole GH of the upper guide plate 40.

Referring to FIG. 9a, a test for electrical characteristics of a semiconductor device is performed by approaching the wafer W to the probe card 100 having the plurality of contact pins 80 and then bringing the contact pins 80 into contact with the corresponding electrode pads WP on the wafer W. When bringing the contact pins 80 into contact with the electrode pads WP on the wafer W, a process of further bringing the wafer W into contact with the probe card 100 is performed after reaching a state in which the contact pins 80 and the electrode pads WP begin to make contact with each other. Referring to FIG. 9b, the contact pins 80 are elastically deformed by an overdrive process. By the overdrive process, all the contact pins 80 can be reliably brought into contact with the electrode pads WP even when the heights of the electrode pads WP or the heights of the contact pins 80 vary. In addition, as each contact pin 80 is elastically deformed during the overdrive process and a tip thereof moves on an electrode pad WP, scrubbing is performed. The scrubbing removes an oxide film on a surface of the electrode pad WP and can reduce contact resistance.

When the contact pin 80 is elastically deformed during the overdrive process, a desired amount of overdrive can be secured through the configuration of the slit 85 of the contact pin 80, and the length of the contact pin 80 can be shortened while securing a desired needle pressure and allowable time current characteristics. That is, since the length of the contact pin 80 can be shortened to equal to or less than 10 mm, inductance can be reduced and thus high frequency characteristics can be improved.

Figure 11:
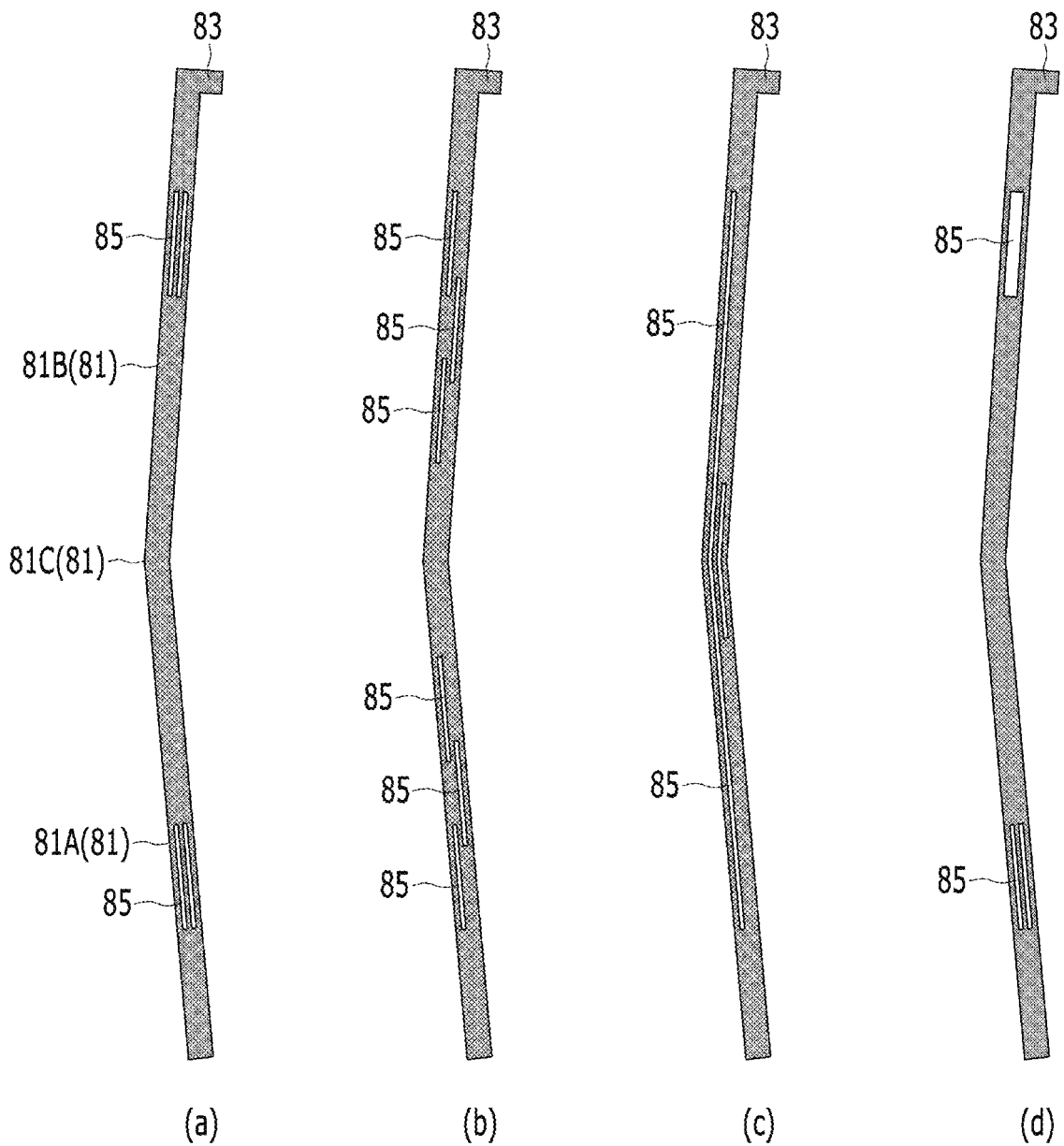
Figure 12:
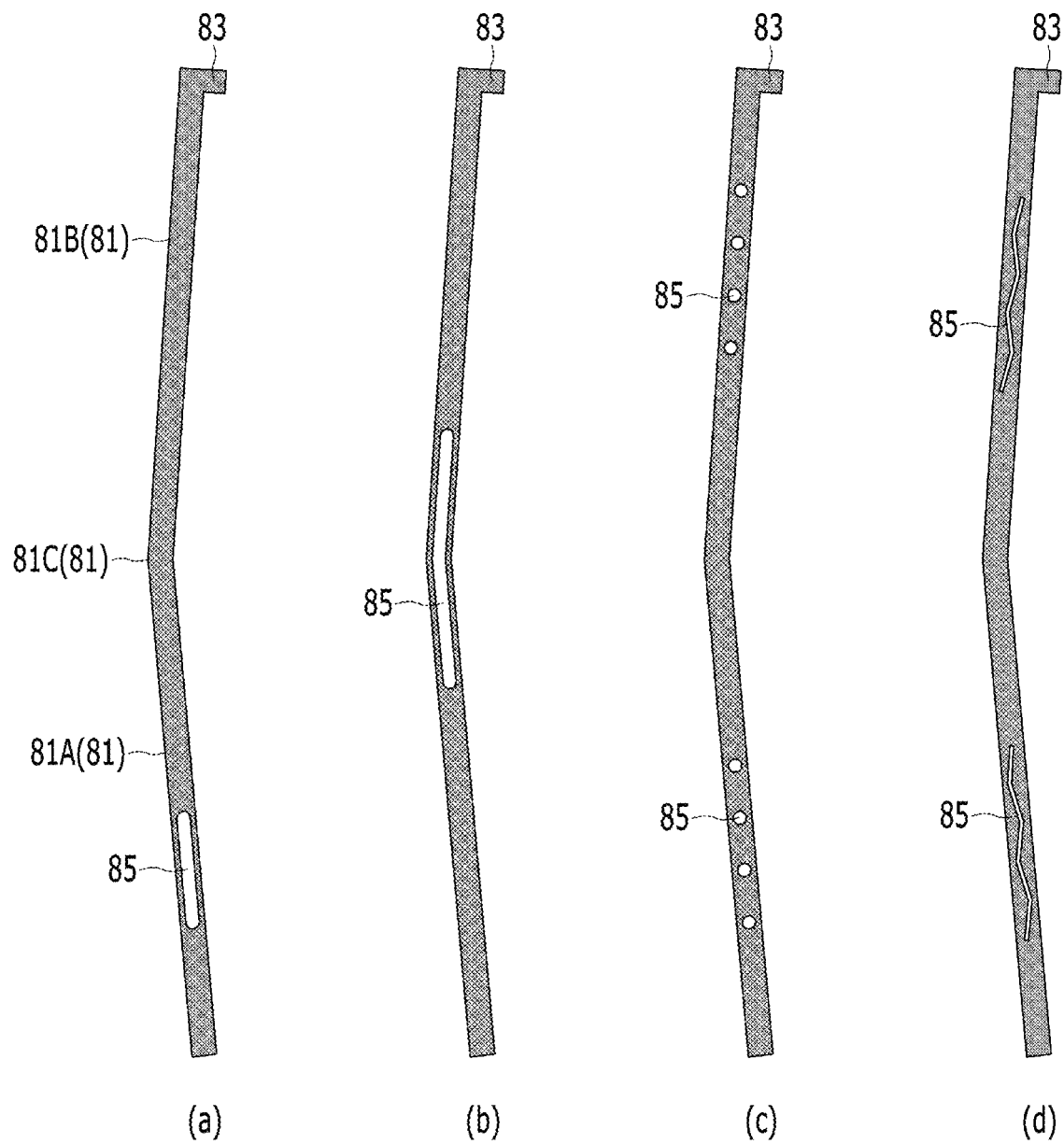

Referring to FIGS. 10 to 12, the configuration of various embodiments of the molded product, preferably the contact pin 80, will be described.

Referring to FIG. 10, the slit 85 may be formed in the second body portion 81B (a). Alternatively, the slit 85 may be formed in each of the first body portion 81A and the second body portion 81B (b). Alternatively, the slit 85 may be formed at the connection point 81C of the first body portion 81A and the second body portion 81B (c). Alternatively, the slit 85 may be continuously formed in the first body portion 81A and the second body portion 81B (d).

Referring to FIG. 11, a plurality of slits 85 may be provided in the width direction of the body portion 81. For example, two slits 85 may be formed side by side in each of the first body portion 81A and the second body portion 81B (a). Alternatively, a plurality of slits 85 may be provided such that projection areas between at least two slits 85 overlap each other (b). Alternatively, a plurality of slits 85 may be provided to have different lengths, and at least one of the slits 85 may be continuously formed in the first body portion 81A and the second body portion 81B (c). Alternatively, the number of slits 85 formed in the first body portion 81A and the number of slits 85 formed in the second body portion 81B may be different, and the slits 85 may have different widths (d).

Referring to FIG. 12, the slit 85 may have a round shape. The slit 85 may have a round shape and may be provided in the first body portion 81A or the second body portion 81B (a). Alternatively, the slit 85 may have a round shape and may be continuously formed in the first body portion 81A and the second body portion 81B (b). Alternatively, the slit 85 may have a circular shape, and a plurality of circular slits 85 may be provided in the first body portion 81A and/or the second body portion 81B (c). Alternatively, the slit 85 may be formed in a sine wave shape or a "W" shape (d).

Figure 13A:
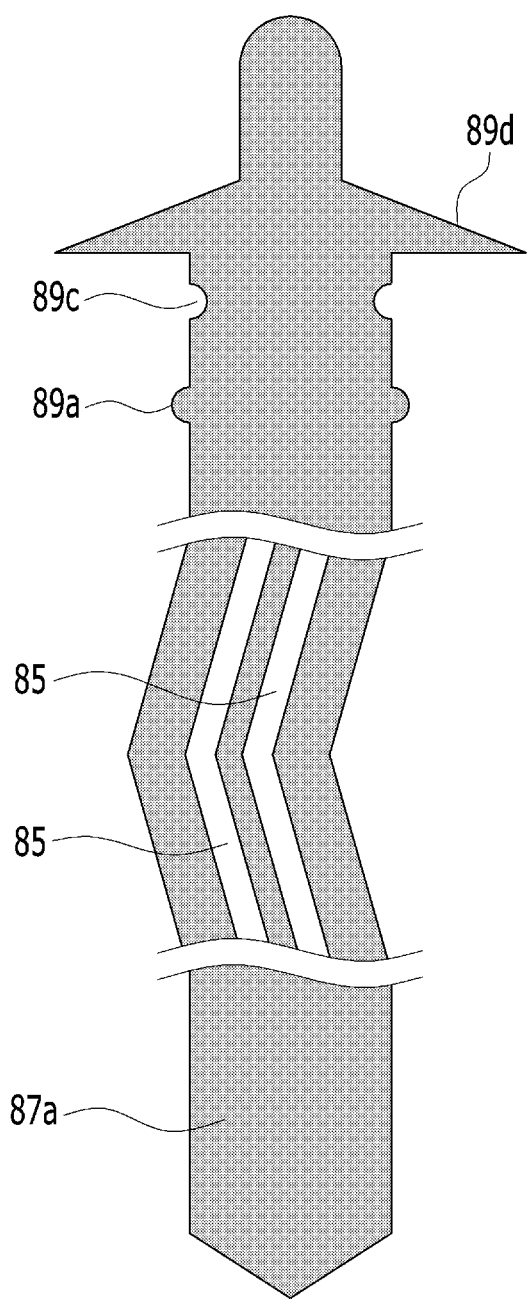
FIG. 13a is a partial front view illustrating a contact pin according to an embodiment of the present disclosure.
Figure 13B:
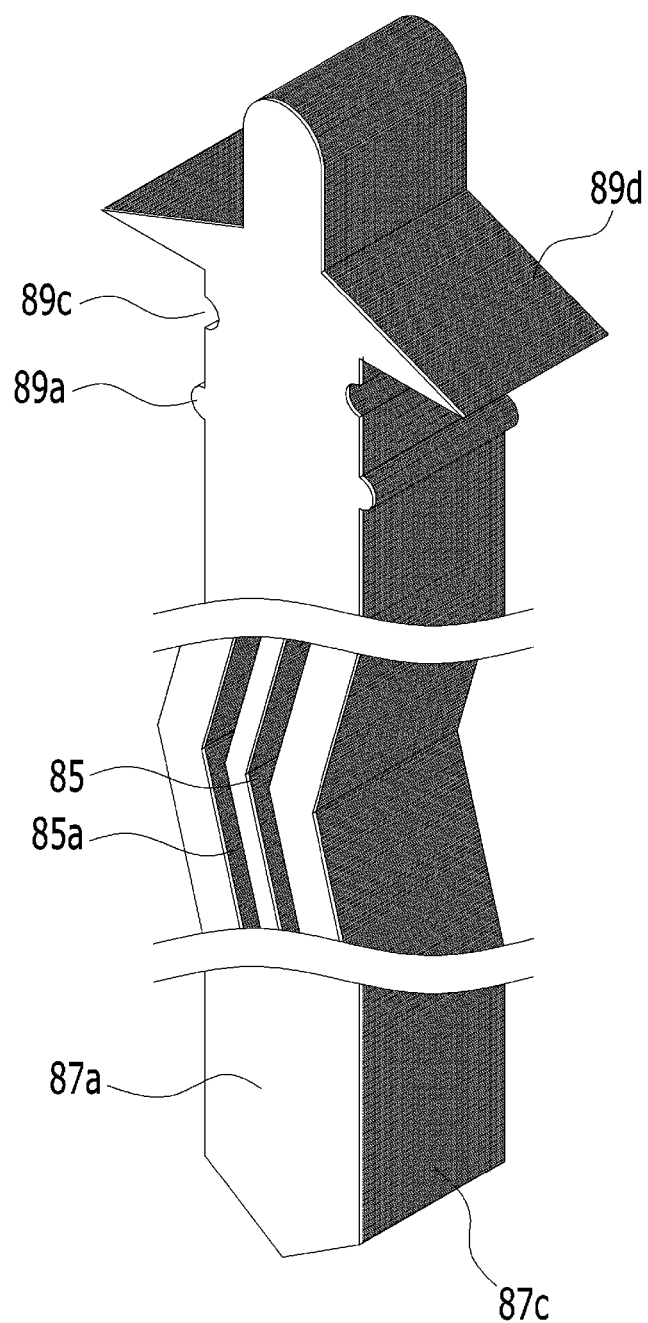
FIG. 13b is a partial perspective view illustrating the contact pin according to the embodiment of the present disclosure.
Figure 13C:
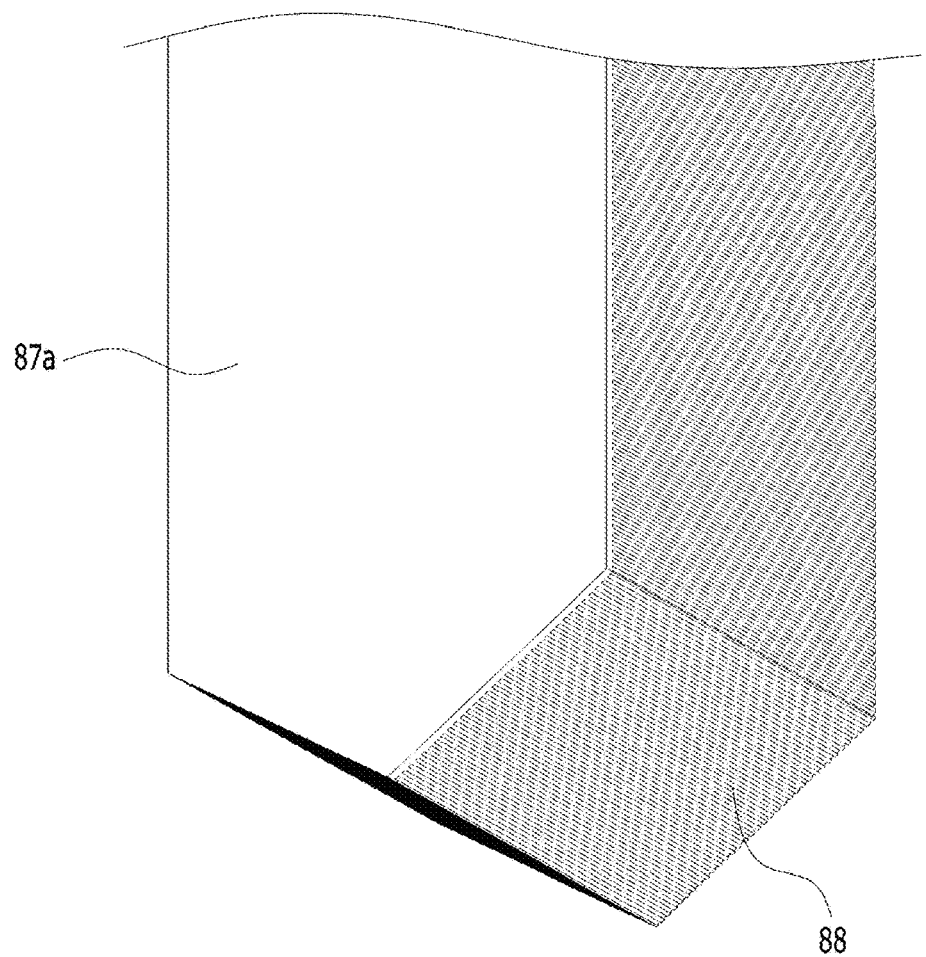
FIG. 13c is a partial perspective view illustrating the contact pin according to the embodiment of the present disclosure.
Figure 13D:
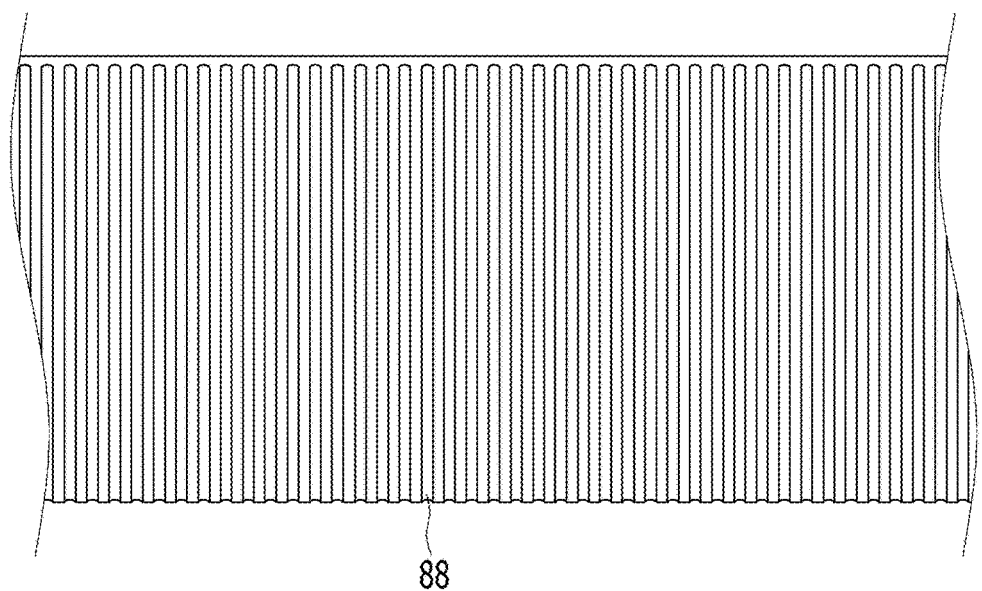
FIG. 13d is a partial side view illustrating the contact pin according to the embodiment of the present disclosure.
Figure 14A:
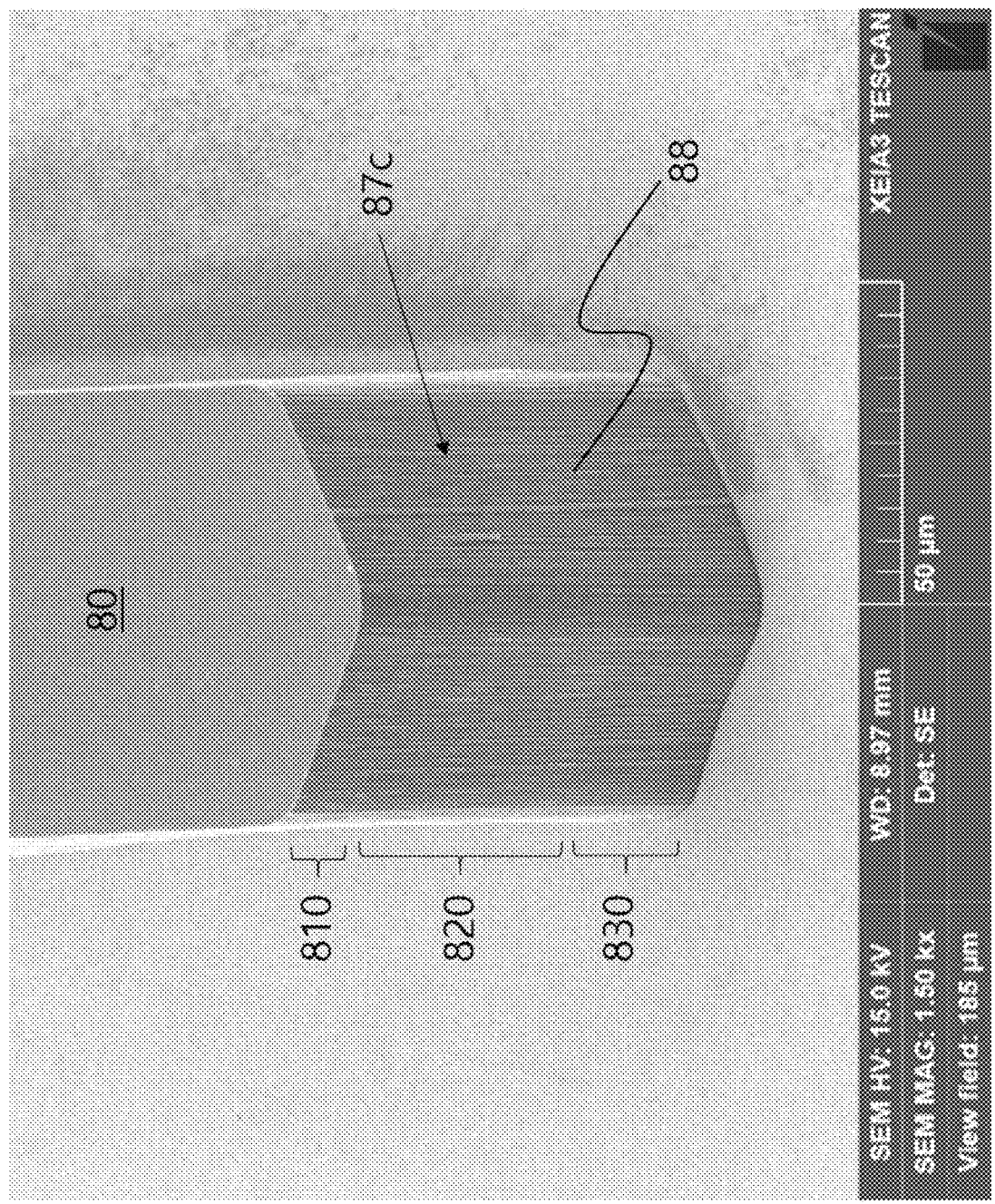
FIGS. 14a to 14c are views illustrating scanning electron microscope (SEM) images of the contact pin according to the embodiment of the present disclosure.
Figure 14B:
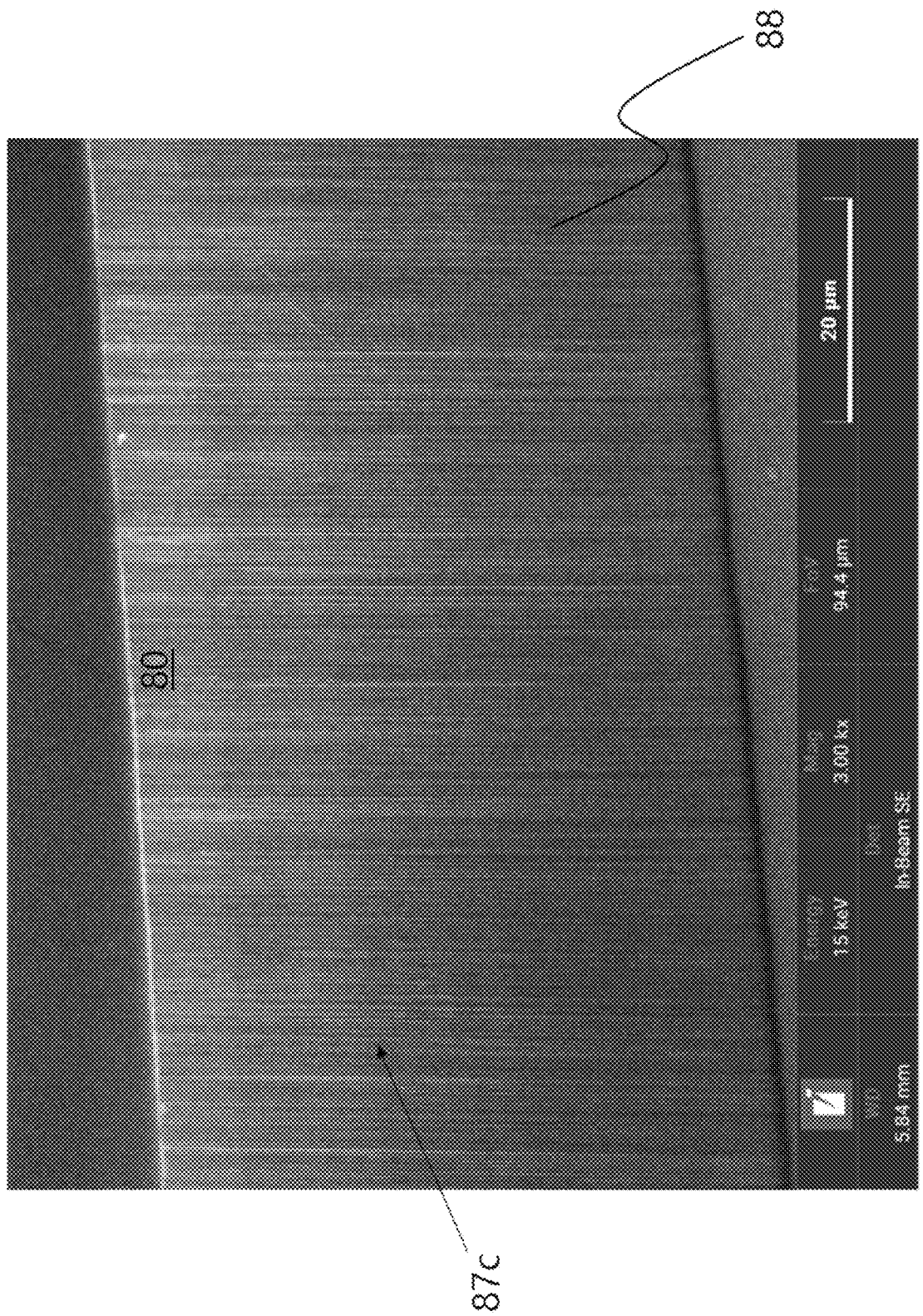
Figure 14C:
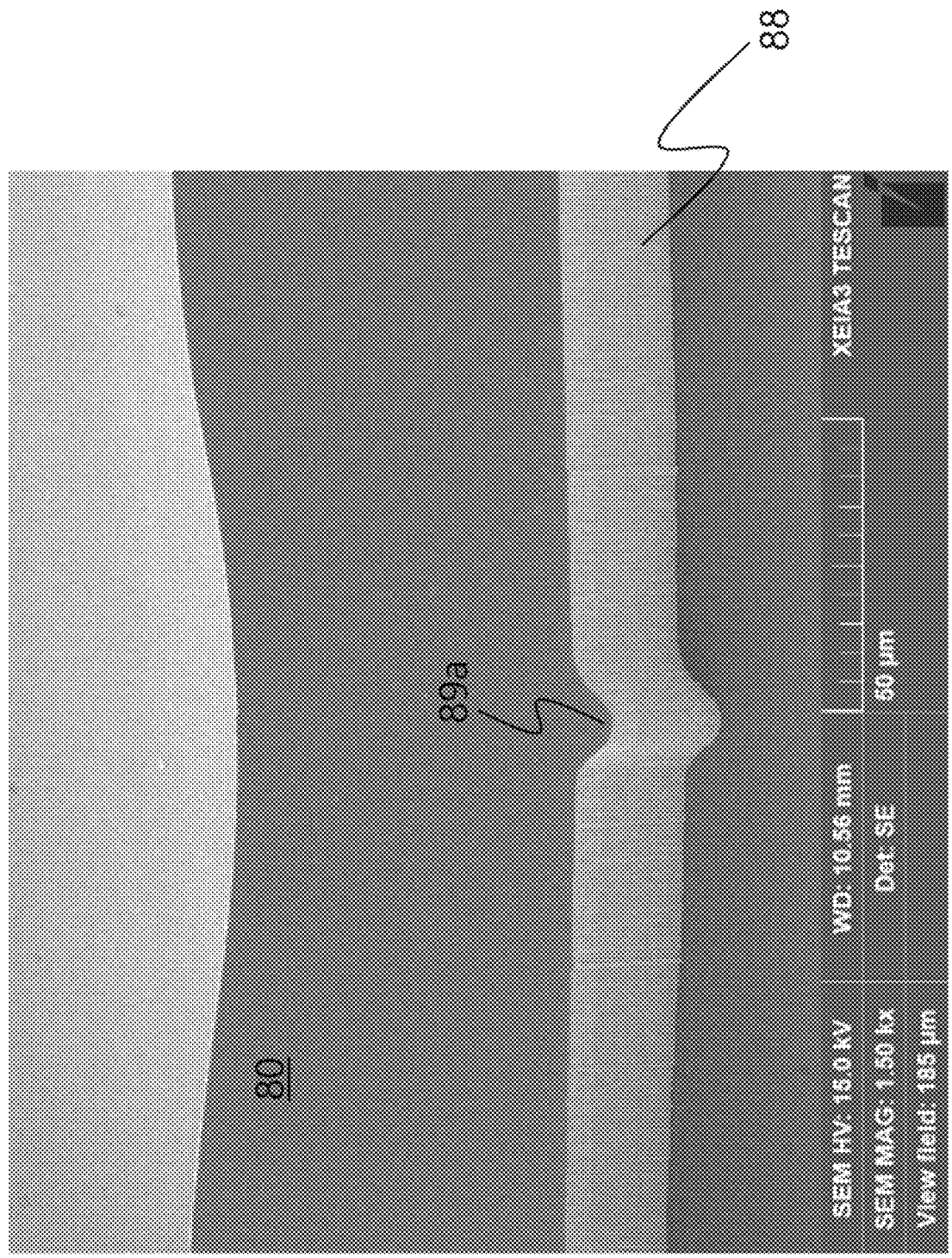

FIG. 13*a* is a front view illustrating parts of an electrically conductive contact pin 80 according to an embodiment of the present disclosure cut in the longitudinal direction. FIG. 13*b* is a perspective view of FIG. 13*a*. FIG. 13*c* is a perspective view illustrating a lower end of the contact pin 80. FIG. 13*d* is a partial side view illustrating the contact pin 80. FIG. 14*a* is a view illustrating a scanning electron microscope (SEM) image of the lower end of the contact pin 80. FIG. 14*b* is a view illustrating an SEM image of a side surface of the contact pin 80. FIG. 14*c* is a view illustrating an SEM image of a micro-convex portion 89*a* of the contact pin 80.

Referring to FIGS. 13 and 14, the electrically conductive contact pin 80 according to the embodiment of the present disclosure includes opposite ends that make contact with respective contact objects and a central portion provided between the opposite ends. The central portion includes a slit 85 passing through a first surface 87*a* and a second surface (not illustrated). Since the central portion is bent at a predetermined angle, the contact pin 80 is more easily elastically deformed, and the deformation direction corresponds to the bending direction and is always constant. An upper portion of the contact pin 80 is provided with a locking protrusion 89*d* extending from a lower side of an upper tip thereof.

The contact pin 80 according to the embodiment of the present disclosure includes a plurality of fine trenches 88 provided on at least a surface thereof. In detail, the fine trenches 88 are formed on a side surface 87*c* of the contact pin 80. On the side surface 87C of the contact pin 80, the fine trenches 88 are formed to extend in the thickness direction of the contact pin 80. Here, the thickness direction of the contact pin 80 means a direction in which the metal filler 230 grows during electroplating.

The fine trenches 88 have a depth in the range of 20 nm to 1 μm and a width in the range of 20 nm to 1 μm. Here, because the fine trenches 88 are resulted from the formation of the pores formed during the manufacture of the anodic aluminum oxide mold 200, the width and depth of the fine trenches 88 are equal or less than the diameter of the pores formed in the anodic aluminum oxide mold 200. On the other hand, in the process of forming the openings 210 in the anodic aluminum oxide mold 200, portions of the pores of the anodic aluminum oxide mold 200 may be crushed by an etchant to at least partially form a fine trench 88 having a depth greater than the diameter of the pores formed during the anodization.

Since the anodic aluminum oxide mold 200 includes a large number of pores, at least portions of the anodic aluminum oxide mold 200 is etched to form the openings 210, and the metal filler 230 is formed in the openings 210 by electroplating, the fine trenches 88 are formed on the side surface of the contact pin 80 as a result of contact between the contact pin 80 and the pores of the anodic aluminum oxide mold 200.

The contact pin 80 has a first surface 87*a*, a second surface (not illustrated) opposite to the first surface 87*a*, and the side surface 87C connecting the first surface 87*a* and the second surface (not illustrated) to each other. The contact pin 80 includes a plurality of fine trenches 88 formed side by side on the side surface 87*c* in the form of long grooves extending toward the first surface 87*a* and the second surface (not illustrated).

The fine trenches 88 are formed on the entire side surface 87*c* of the contact pin 80, but are not formed on the first surface 87*a* and the second surface (not illustrated) except for the side surface 87*c*.

The fine trenches 88 as described above can contribute to increasing the surface area of the side surface of the contact pin 80. In other words, even when the contact pin 80 according to the embodiment of the present disclosure has the same shape and dimensions as a conventional electrically conductive contact pin, the surface area of the side surface 87*c* of the contact pin 80 can be increased.

In addition, with the configuration of the fine trenches 88 formed on the side surface 87*c* of the contact pin 80, the torsional resistance ability of the contact pin 80 against deformation can be improved. During overdrive, the contact pin 80 slides in contact with an inner surface of the guide holes GH of the guide plate GP in the bending direction or in the opposite direction. When the contact pin 80 receives a torsional load, the fine trenches 88 provided on the side surface 87*c* of the contact pin 80 to be parallel to a pressing surface enable the contact pin 80 to withstand twisting. This prevents twisting of the contact pin 80 from occurring and prevents a contact surface from being reduced during sliding, thereby minimizing generation of cutting foreign substances on the side surface.

In addition, with the configuration of the fine trenches 88 formed on the side surface 87*c* of the contact pin 80, the elastic restoring ability of the contact pin 80 against deformation can be improved.

In addition, with the configuration of the fine trenches 88 formed on the side surface 87*c* of the contact pin 80, heat generated in the contact pin 80 can be rapidly dissipated, thereby suppressing a rise in the temperature of the contact pin 80.

In addition, with the configuration of the fine trenches 88 provided on the side surface of each end of the contact pin 80 in contact with a contact object, the contact resistance of the contact pin 80 can be reduced when making contact with the contact object. In addition, when the contact pin 80 slides up and down in contact with the guide holes GH of the guide plates GP, the fine trenches 88 provided on the side surface of the contact pin 80 reduce the frictional resistance of the contact pin 80 with the guide holes GH, thereby enabling efficient sliding.

Meanwhile, at least one end of each of the fine trenches 88 may be spaced apart from the adjacent first surface 87*a* or second surface (not illustrated) by a distance of 10 nm to 500 nm. The anodic aluminum oxide mold 200 may include a barrier layer and a porous layer formed during the manufacture of the anodic aluminum oxide film. In this case, the thickness of the barrier layer may be in the range of 10 nm to 500 nm. According to the configuration in which the anodic aluminum oxide mold 200 is disposed such that the barrier layer is located on the porous layer and the openings 210 are formed by etching with a photoresist patterned on an upper surface of the barrier layer, as illustrated in FIG. 13*d*, due to the presence of the barrier layer, the fine trenches 88 may be formed spaced apart from the upper surface by a distance of 10 nm to 500 nm.

The contact pin 80 includes the slit 85 formed inside the contact pin 80 so as to pass through the first surface 87*a* and the second surface (not illustrated). The configuration of the slit 85 may be the same as that of the above-described embodiment. In this case, a slit fine trench 85*a* formed long in the thickness direction of the contact pin 80 is provided on a side surface of the slit 85. The slit fine trench 85*a* is resulted from the formation of the island 250 formed during the manufacture of the anodic aluminum oxide mold 200. The width and depth of the slit fine trench 85a are the same as those of the fine trenches 88.

In the contact pin 80, the roughness range of the side surface 87c is different from those of the first surface 87a and the second surface (not illustrated). According to the configuration in which a large number of fine trenches 88 having a width and depth of several tens of nanometers are formed, the roughness range of the side surface 87c of the contact pin 80 is greater than those of the first surface 87a and the second surface (not illustrated) of the contact pin 80.

The contact pin 80 is formed by stacking a plurality of layers in the thickness direction of the contact pin 80, and the same layers may be made of the same metal material. Referring to FIG. 14a, the contact pin 80 may be provided in a structure in which three metal layers are stacked. A first layer 810 and a third layer 830 have excellent hardness characteristics to provide excellent mechanical elasticity to the contact pin 80, and a second layer 820 provides electrical characteristics of excellent electrical conductivity. The first layer 810 and the third layer 830 may be made of nickel (Ni) or a nickel (Ni) alloy, and the second layer 820 may be made of copper (Cu) or a copper (Cu) alloy. With this configuration, it is possible to provide a contact pin having excellent mechanical properties and excellent electrical properties at the same.

The contact pin 80 may include at least one micro-trench 89c and a plurality of fine trenches 88 formed on the side surface 87c of the contact pin 80. The micro-trench 89c may be formed long in the thickness direction of the contact pin 80 with a depth in the range of 1 µm to 10 µm. The fine trenches 88 may be formed long in the thickness direction of the contact pin 80 with a depth in the range of 20 nm to 1 µm.

The micro-trench 89c prevents burrs from protruding outward from the side surface of the contact pin 80 and damaging a guide plate GP. The burrs are generated as a result of removing a connecting portion connecting the plurality of contact pins 80 to each other during the manufacture of the contact pins 80.

The contact pin 80 may include at least one micro-convex portion 89a and a plurality of fine trenches 88 formed on the side surface 87c of the contact pin 80. The micro-convex portion 89a may be formed long in the thickness direction of the contact pin 80 with a height in the range of 1 µm to 10 µm. The fine trenches 88 may be formed long in the thickness direction of the contact pin 80 with a height in the range of 20 nm to 1 µm.

The upper portion of the contact pin 80 is provided with the locking protrusion 89c preventing the contact pin 80 from being separated from the guide plate GP. As the locking protrusion 89c is supported by the guide plate GP, the contact pin 80 is not separated from the guide plate GP. The micro-convex portion 89a has a protruding length smaller than that of the locking protrusion 89c, and is preferably formed with a protruding height in the range of 1 µm to 10 µm. The micro-convex portion 89a minimizes the movement of the contact pin 80 caused by the clearance between the guide hole GH of the guide plate GP and the contact pin 80. In addition, the micro-convex portion 89a enables the contact pin 80 to be more easily deformed by inclining an upper end of the contact pin 80 in one direction.

The electrically conductive contact pin 80 according to the embodiment of the present disclosure is different from a conventional one in that it is manufactured using the anodic aluminum oxide mold 200 instead of a conventional photoresist mold. With this change in the type of mold, there is an effect of realizing shape precision, a fine shape, and an increase in the surface area of a side surface, which were limited in realization with the photoresist mold.

Figure 15B:
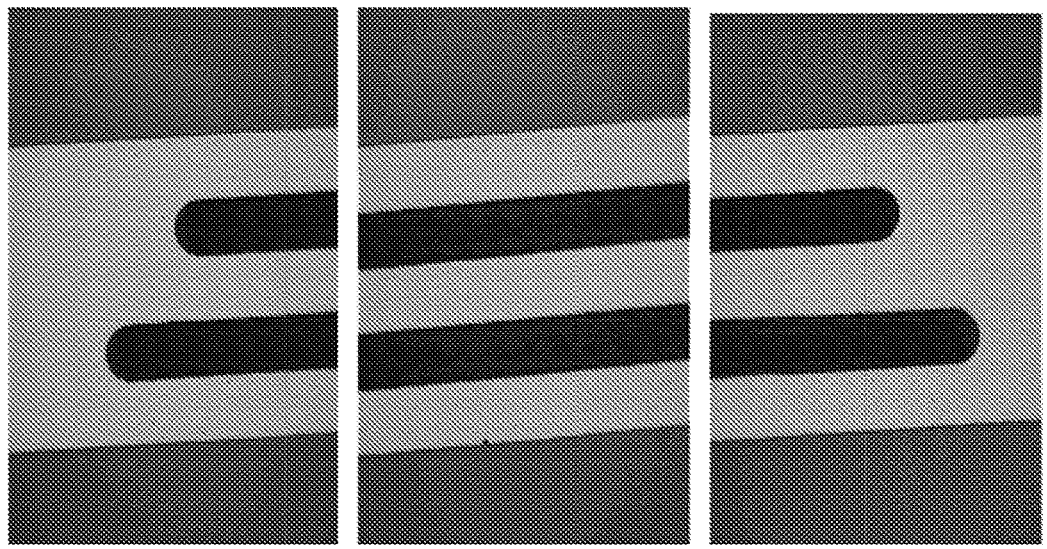
FIG. 15b is a view illustrating SEM images of the contact pin according to the embodiment of the present disclosure.
Figure 15A:
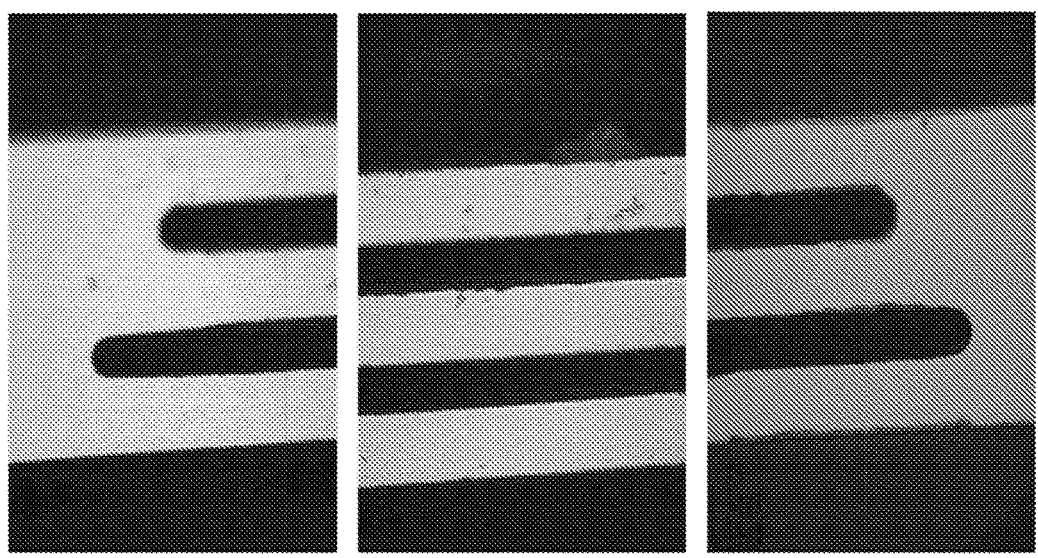
FIG. 15a is a view illustrating SEM images of a comparative example.

Referring to FIG. 15, FIG. 15a is a view illustrating SEM images of a part of an electrically conductive contact pin (hereinafter, referred to as a "comparative example") manufactured using a conventional photoresist mold, and FIG. 15b is a view illustrating SEM images of a part of an electrically conductive contact pin manufactured using the anodic aluminum oxide mold 200 according to the embodiment of the present disclosure.

The comparative example and the embodiment of the present disclosure have the same width, and at least a partial configuration constituting the shape of the contact pin has a dimension range of 1 µm to 10 µm.

The comparative example includes a partial configuration having a dimension range of 1 µm to 10 µm, which is formed regardless of a design pattern. However, the dimension range of 1 µm to 10 µm of a partial configuration according to the embodiment of the present disclosure is a dimension range in which a design pattern is transferred and is not a dimension range formed regardless of the design pattern. As such, while the comparative example forms a distorted pattern in the dimension range of 1 µm to 10 µm, the contact pin according to the embodiment of the present disclosure does not form a distorted pattern in the dimension range of 1 µm to 10 µm other than the design pattern. In order to stabilize a plating solution during electroplating, an alkali component is mixed in the plating solution and used. However, in the case of the comparative example using the photoresist mold, since the photoresist mold partially reacts with the alkali component of the plating solution, a distorted pattern unrelated to the design pattern is formed. Such an unintended shape of the comparative example occurs more frequently when photoresists are stacked in multiple layers. However, in the embodiment of the present disclosure using the anodic aluminum oxide mold 200, since the anodic aluminum oxide mold 200 is made of a single anodic aluminum oxide and the selectivity of the plating solution is expanded to minimize the reactivity with the plating solution, pattern with a distorted shape unrelated to the design pattern is not formed.

According to the method for manufacturing the electrically conductive contact pin 80 according to the embodiment of the present disclosure, since the photoresist is only used for patterning the anodic aluminum oxide mold 200 and the anodic aluminum oxide mold 200 is used for electroplating the metal filler 230, it is possible to manufacture a contact pin 80 having a vertical side surface.

Figure 16B:
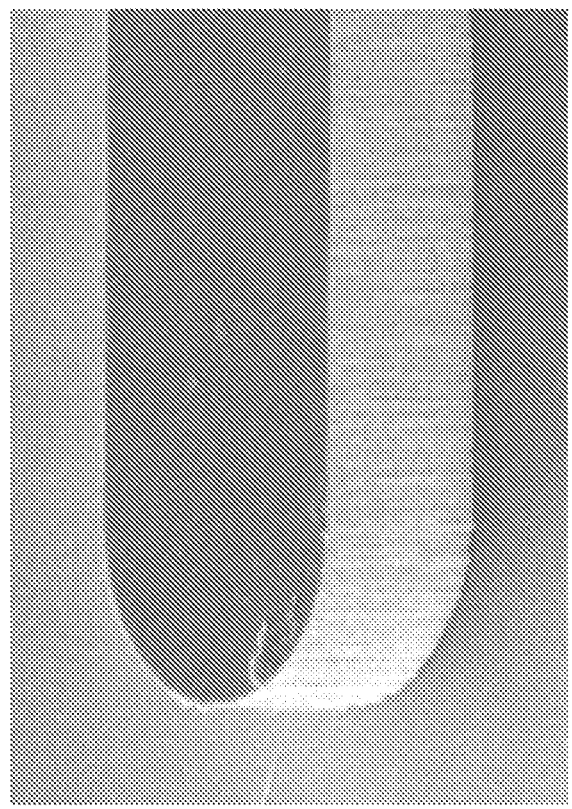
FIG. 16b is a view illustrating an SEM image of the contact pin according to the embodiment of the present disclosure.
Figure 16A:
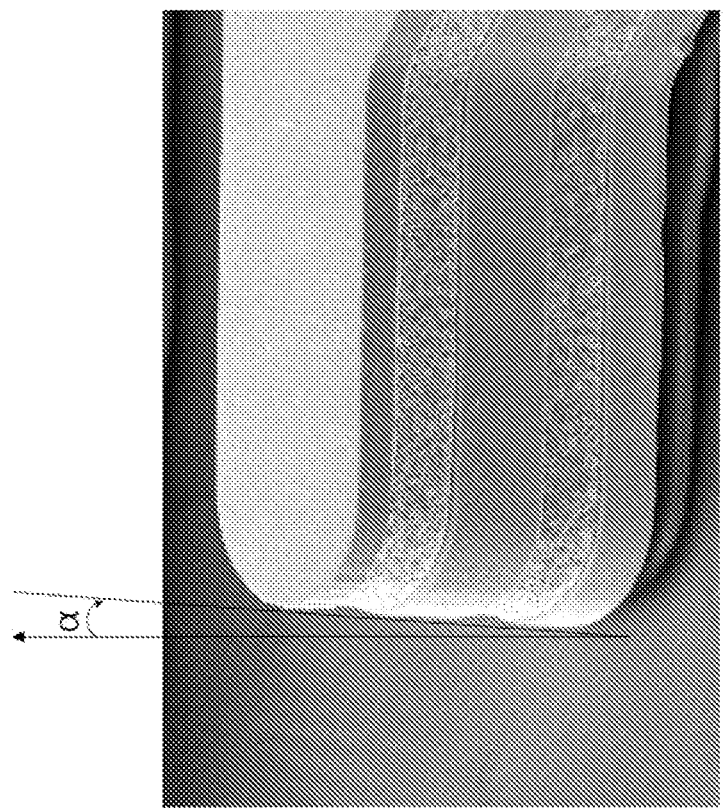
FIG. 16a is a view illustrating an SEM image of the comparative example.

Referring to FIG. 16, FIG. 16a is a view illustrating an SEM image of a part of the comparative example, and FIG. 16b is a view illustrating an SEM image of a part of the electrically conductive contact pin manufactured using the anodic aluminum oxide mold 200 according to the embodiment of the present disclosure. In the case of the comparative example using the photoresist mold, since photoresists have to be stacked in multiple layers in order to manufacture a contact pin having a predetermined thickness, a side surface of the contact pin is not vertical due to the multi-layered structure of the photoresist mold. As illustrated in FIG. 16a, the side surface of the comparative example has an inclined shape with a verticality of a angle with respect to a vertical line. Here, the a angle is in the range of 3° to 10°. When the a angle exceeds 10°, the contact pin is regarded as a defective product and cannot be used. In addition, the side surface of the comparative example has a stepped shape toward a first surface (upper surface). However, as illustrated in FIG. 16b, a side surface of the contact pin 80 according to the embodiment of the present disclosure has a verticality in the range of 0.1° to 3°. Preferably, the verticality is equal to or less than 1°. When the side surface of the contact pin is not vertical but stepped or inclined as in the comparative example, since the contact area of an end of the contact pin with the contact object is reduced, the durability of the contact pin is reduced and unintentional twisting occurs. Unlike this, in the case of the contact pin 80 according to the embodiment of the present disclosure, the contact area of an end with the contact object is increased compared to the related art, thereby preventing durability degradation and unintentional twisting of the contact pin 80.

As described above, since the present disclosure is manufactured using the anodic aluminum oxide mold instead of a photoresist mold, the contact pin 80 having a vertical side surface can be manufactured to a sufficient height.

In addition, even when the contact pin 80 according to the embodiment of the present disclosure has the same shape and dimensions as the contact pin manufactured using the conventional photoresist mold, the surface area of the side surface 87c of the contact pin 80 can be increased.

The electrically conductive contact pin 80 according to the embodiment of the present disclosure may be used in an inspection apparatus such as a probe card as illustrated in FIG. 1.

In addition, the electrically conductive contact pin 80 according to the embodiment of the present disclosure may be used in an inspection apparatus such as a test socket. In this case, the electrically conductive contact pin 80 may be used for electrically connecting a contact terminal of a semiconductor device to a probe terminal of the test socket. Preferably, the test socket includes a socket body provided with electrically conductive contact pins, and a floating member coupled to the socket body and having a central storage space for accommodating the semiconductor device. Here, the electrically conductive contact pins provided in the socket body may include the above-described configurations of the electrically conductive contact pin 80 according to the embodiment of the present disclosure.

As described above, the present disclosure has been described with reference to the exemplary embodiments. However, those skilled in the art will appreciate that various modifications, additions, and substitutions are possible, without departing from the scope and spirit of the present disclosure as disclosed in the accompanying claims.

What is claimed is:

1. An electrically conductive contact pin having a first surface, a second surface opposite to the first surface, and a side surface connecting the first and second surfaces,
    wherein the electrically conductive contact pin has a longitudinal direction in which the contact pin makes contact with a circuit board and an object to be inspected, and a thickness direction perpendicular to the longitudinal direction,
    wherein the electrically conductive contact pin comprising a plurality of fine trenches formed side by side on the side surface of the electrically conductive contact pin in the form of long grooves extending in thickness direction of electrically conductive contact pin toward the first surface and the second surface,
    wherein the fine trenches are formed on the entire side surface of the contact pin, but are not formed on the first surface and the second surface except for the side surface,
    wherein each of the fine trenches has a depth in the range of 20 nm to 1 μm and a width in the range of 20 nm to 1 μm, and
    wherein the fine trenches are formed in contact with pores of an anodic aluminum oxide mold along the thickness direction.

2. The electrically conductive contact pin of claim 1, wherein the contact pin has a thickness in a range of 10 μm to 150 μm, and the side surface of the contact pin has a vertical shape with a verticality in a range of 0.1° to 3°.

3. The electrically conductive contact pin of claim 1, wherein the contact pin is formed by stacking a plurality of layers in a thickness direction of the contact pin, and the same layers are made of the same metal material.

4. The electrically conductive contact pin of claim 1,
    wherein a roughness range of the side surface is different from roughness ranges of the first surface and the second surface.

5. The electrically conductive contact pin of claim 4, wherein the roughness range of the side surface is greater than the roughness ranges of the first surface and the second surface.

6. An inspection apparatus comprising an electrically conductive contact pin configured to make contact with an inspection object,
    wherein the electrically conductive contact pin having a first surface, a second surface opposite to the first surface, and a side surface connecting the first and second surfaces,
    wherein the electrically conductive contact pin has a longitudinal direction in which the contact pin makes contact with a circuit board and an object to be inspected, and a thickness direction perpendicular to the longitudinal direction,
    wherein at least a partial configuration constituting a side surface shape of the electrically conductive contact pin has a dimension range of 1 μm to 10 μm, and the dimension range of 1 μm to 10 μm of the partial configuration is a dimension range in which a design pattern is transferred and is not a dimension range formed regardless of the design pattern,
    wherein the electrically conductive contact pin comprises a plurality of fine trenches formed side by side on the side surface of the electrically conductive contact pin in the form of long grooves extending in the thickness direction of the electrically conductive contact pin toward the first surface and the second surface,
    wherein the fine trenches are formed on the entire side surface of the contact pin, but are not formed on the first surface and the second surface except for the side surface,
    wherein each of the fine trenches has a depth in the range of 20 nm to 1 μm and a width in the range of 20 nm to 1 μm, and
    wherein the fine trenches are formed in contact with pores of an anodic aluminum oxide mold along the thickness direction.

7. A molded product having a first surface, a second surface opposite to the first surface, and a side surface connecting the first and second surfaces,
    wherein the molded product has a longitudinal direction in which the molded product makes contact with a circuit board and an object to be inspected, and a thickness direction perpendicular to the longitudinal direction,
    wherein at least a partial configuration constituting a shape of the molded product has a dimension range of 1 μm to 10 μm, and the dimension range of 1 μm to 10 μm of the partial configuration is a dimension range in which a design pattern is transferred and is not a dimension range formed regardless of the design pattern, wherein the molded product comprises a plurality of fine trenches formed side by side on the side surface of the molded product in the form of long grooves extending in the thickness direction of the molded product toward the first surface and the second surface, wherein the fine trenches are formed on the entire side surface of the contact pin, but are not formed on the first surface and the second surface except for the side surface, wherein each of the fine trenches has a depth in the range of 20 nm to 1 μm and a width in the range of 20 nm to 1 μm, and wherein the fine trenches are formed in contact with pores of an anodic aluminum oxide mold along the thickness direction.

8. The molded product of claim 7, wherein the molded product has a thickness in a range of 10 μm to 150 μm, and is made of an electrically conductive material.

* * * * *